United States Patent [19]
Ryat

[11] Patent Number: 5,825,167
[45] Date of Patent: *Oct. 20, 1998

[54] LINEAR TRANSCONDUCTORS

[75] Inventor: Marc Ryat, Santa Clara, Calif.

[73] Assignee: SGS-Thomson Microelectronics, Inc., Carrollton, Tex.

[*] Notice: The term of this patent shall not extend beyond the expiration date of Pat. No. 5,684,393.

[21] Appl. No.: 885,059

[22] Filed: Jun. 30, 1997

Related U.S. Application Data

[63] Continuation of Ser. No. 457,465, Jun. 1, 1995, Pat. No. 5,684,393, which is a continuation of Ser. No. 31,647, Mar. 19, 1993, Pat. No. 5,451,859, which is a continuation-in-part of Ser. No. 950,091, Sep. 23, 1992, Pat. No. 5,498,952.

[51] Int. Cl.$^6$ .................................................. G05F 3/16
[52] U.S. Cl. ...................... 323/312; 323/315; 363/73
[58] Field of Search .............................. 323/312, 313, 323/315, 316, 317, 281; 363/73; 330/250

[56] References Cited

U.S. PATENT DOCUMENTS

| | | | |
|---|---|---|---|
| 4,330,744 | 5/1982 | Embree et al. | 323/316 |
| 4,437,023 | 3/1984 | Gill, Jr. | 307/296 R |
| 4,550,262 | 10/1985 | Kohsiek | 307/260 |
| 4,591,780 | 5/1986 | Yamada et al. | 323/313 |
| 4,703,249 | 10/1987 | De La Plaza et al. | 323/316 |
| 4,733,196 | 3/1988 | Menniti et al. | 330/288 |
| 4,740,766 | 4/1988 | Metz | 323/316 |
| 4,742,292 | 5/1988 | Hoffman | 323/314 |
| 4,879,505 | 11/1989 | Barrow et al. | 323/312 |
| 4,897,596 | 1/1990 | Hughes | 323/315 |
| 4,970,452 | 11/1990 | Barbu et al. | 323/317 |
| 5,038,053 | 8/1991 | Djenguerian et al. | 307/310 |
| 5,173,656 | 12/1992 | Seevinck et al. | 323/314 |
| 5,451,859 | 9/1995 | Ryat | 323/312 |
| 5,684,393 | 11/1997 | Ryat | 323/312 |

FOREIGN PATENT DOCUMENTS

| | | |
|---|---|---|
| 3432561 | 3/1986 | Germany . |
| 60-236308 | 11/1985 | Japan . |

OTHER PUBLICATIONS

Wang et al., "A voltage–controllable linear MOS transconductor using bias offset technique" 25 IEEE Journal of Solid–State Circuits, pp. 315–317 (Feb. 1990).

Van de Plassche, "A wide–band monolithic instrumentation amplifier" 10 IEEE Journal of Solid–State Circuits, 424–31 (Dec. 1975).

Pookaiylaudom et al., "An integratable precision voltage–to–current convertor with bilateral capability" 13 IEEE Journal of Solid–State Circuits, Jun. 1978.

Section 2.12 of Feucht, Handbook of Analog Circuit Design (1990).

Blauschild, An open loop programmable amplifier with extended frequency range 16 IEEE Journal of Solid–State Circuits, 626–33 (Dec. 1981).

*Primary Examiner*—Adolf Berhane
*Attorney, Agent, or Firm*—David V. Carlson; Theodore E. Galanthay; Lisa K. Jorgenson

[57] ABSTRACT

An integrated transconductor circuit in which the input transistor(s) passes a current across a reference resistor. This conventional arrangement produces current error terms of Vbe/R and Ib. According to the present invention, these terms are compensated by providing a compensation resistor which is matched to the first resistor, and a compensation transistor which is matched to the input transistor, interconnected to feed the appropriate current components to the output. For even better compensation, an additional transistor is optionally added to remove the effect of base current of the compensation transistor. In differential embodiments, the compensation resistor may be bridged or split. Zero, one, or more stages of current mirroring can optionally be used to provide the desired output.

11 Claims, 17 Drawing Sheets

LINEAR TRANSCONDUCTORS

CROSS REFERENCE TO RELATED APPLICATION

This application is a continuation of application Ser. No. 08/457,465, filed on Jun. 1, 1995, now issued as U.S. Pat. No. 5,684,393, which is a continuation of application Ser. No. 08/031,647, filed on Mar. 15, 1993, now issued as U.S. Pat. No. 5,451,859, which is a continuation-in-part of application Ser. No. 07/950,091, filed on Sep. 23, 1992, now issued as U.S. Pat. No. 5,498,952.

BACKGROUND AND SUMMARY OF THE INVENTION

The present invention relates to analog integrated circuits which include linear transconductor elements.

Background: Transconductors

Transconductors (voltage-current conversion devices) are now commonly used in many circuits such as variable-gain amplifiers and analog multipliers. They form the heart of these devices, their properties contributing significantly to the performance of these circuits and determining the distortion, gain, consumption and bandwidth.

Many transconductor construction methods have already been defined, the majority of which are MOS circuits (metal-oxide structure semiconductors). Reference can be made, for example, to the article by Zhenhua Wang and Walter Guggenbuehl "A voltage-controllable linear MOS transconductor using bias offset technique" published in February 1990 in the IEEE JOURNAL OF SOLID-STATE CIRCUITS, Vol. 25, pages 315–317, which is hereby incorporated by reference. However, these MOS implementations have a number of drawbacks specific to this technology, notably low transconductance. Accordingly, while the linearity of the response provided by such devices is good, the gains obtained are always low and input voltage offsets large. This is the reason why bipolar transconductors have also been continued to be of interest.

In one such device, described by Rudy J. Van de Plassche in the article "A wide-band monolithic instrumentation amplifier," 10 IEEE JOURNAL OF SOLID-STATE CIRCUITS 424–431 (December 1975), which is hereby incorporated by reference, two symmetrical amplifiers comprising bipolar transistors are connected by a resistance R. This device provides good linearity and high gain, but the output current depends on the dynamic gain $\alpha$ of the transistors used. The common base gain $\alpha$ of a transistor is equal to $i_c/i_e$, i.e. the ratio of its collector current to its emitter current, and is therefore in the neighborhood of 1. Gain is also commonly expressed using an equivalent gain figure $\beta=\alpha/(1-\alpha)$. This gain itself is substantially dependent on temperature, and therefore constitutes an error source.

Another previously-proposed circuit described in Pookaiyaudom and Surakampontorn, "An integratable precision voltage-to-current converter with bilateral capability," 13 IEEE JOURNAL OF SOLID-STATE CIRCUITS (June 1978), which is hereby incorporated by reference, is a transconductor for use at a relatively low frequency. The device comprises no compensation for the Early effect, the output signal also depending on the factor $\alpha$ and the input dynamic range being limited.

Another previously-proposed circuit suggested by Robert A. Blauschild in the article "An open loop programmable amplifier with extended frequency range," 16 IEEE JOURNAL OF SOLID-STATE CIRCUITS 626–633 (December 1981), which is hereby incorporated by reference, calls for relatively high resistances, and therefore provides only a low gain. The conventional teachings therefore require acceptance of a trade-off between linearity and gain.

Background: Current Generators

The parent application described a current generator, and more particularly a generator providing, from a reference voltage Vref defined with respect to ground, a current equal to Vref/R with only a slight error, where R is a resistor value.

FIG. 1 shows a conventional circuit for such a generator. The generator comprises an operational amplifier OA controlling the base of an NPN transistor T1, the emitter of which is connected to an inverting input of the amplifier OA and to ground through a resistor R. The non-inverting input of amplifier OA is provided with a reference voltage Vref with respect to ground. This reference voltage may be provided, for example, by a conventional temperature- and supply-independent reference voltage generator of the "Band-Gap" type. The collector of transistor T1 is connected to a current output terminal S which provides the reference current to a node of the circuit.

With this configuration, the voltage across resistor R is held to Vref, and the emitter current of transistor T1 is therefore Vref/R. The collector current Ic of transistor T1 (output current) is therefore approximately:

$$Ic \approx (1-1/\beta)\, Vref/R,$$

where $\beta$ designates the current gain of transistor T1. In the presently preferred embodiment, this is typically about 90; but of course this specific value is supplied merely to illustrate the best mode, and is not at all necessary for practising the invention. The generator provides a current proportional to Vref which exhibits a temperature accuracy of approximately 2% over the range from $-55°$ to $+125°$ C. The inaccuracy essentially originates from the term $1/\beta$. By using a MOS transistor instead of the bipolar transistor T1, this term can be made essentially zero, which improves accuracy.

However, the implementation of such a current source requires the use of an operational amplifier. Such an operational amplifier typically includes a large number of components (about 12 transistors), and (for stability) must also be connected to a compensating capacitor (not shown), since the operational amplifier operates in a closed loop mode with a unity gain. In an integrated circuit, such a current source therefore occupies a large area of silicon.

Moreover, the voltage between terminal S and ground has to remain higher than a minimum value equal to Vref+Vcesat, where Vcesat designates the emitter-collector voltage of a bipolar transistor in the saturation state. This minimum value is generally higher when a MOS transistor is used instead of transistor T1. Thus, it is not possible to properly provide current to a node having a variable voltage which may become lower than Vref+Vcesat.

Current Generator of Parent Application

By contrast, the parent application provided an innovative precise current generator (as shown in FIGS. 2–4) which can be integrated onto a small silicon surface, and can provide a precise current to a node of unknown voltage (within a large range).

This current generator includes a first bipolar transistor, the base of which is connected to a reference voltage and the emitter to ground through a first resistor. A first current mirror is connected to mirror the emitter current of this first transistor. The mirrored current is augmented by the base current of a second transistor (matched to the first transistor), and by current Vbe/R passed by a second resistor (matched to the first transistor), which is connected between the base and emitter of the second transistor. The current thus augmented drives a second current mirror. The output of the second mirror provides a precise reference current, determined by the reference voltage and the resistor magnitude.

Disclosed Innovative Transconductor Embodiments

The disclosed innovations provide a number of transconductor embodiments in which the output current not only includes a current component corresponding to that passed by the input transistor(s) which is connected to a respective reference resistor, but also includes a current contribution from a compensation transistor which is matched to the input transistor and from a compensating resistor which is matched to the reference resistor. In differential embodiments the compensating resistor may be split between the two branches, and/or the compensating transistor may be bridged between the input transistors. An additional transistor for base current compensation is preferably (but not necessarily) also added.

BRIEF DESCRIPTION OF THE DRAWINGS

The present invention will be described with reference to the accompanying drawings, which show important sample embodiments of the invention and which are incorporated in the specification hereof by reference, wherein:

FIG. 5 shows a basic sample circuit configuration which achieves a linear transconductance relation.

FIG. 6A shows a modification of the circuit of FIG. 5, which does not require a Darlington.

FIG. 6B shows another variation where the emitters of the output transistors are degenerated for improved current matching.

FIG. 6C shows a simplified circuit for the case where only one output is desired and Vin is larger than 2Vbe+Vcesat.

FIG. 6D is similar to FIG. 6C, except with a multiple current sink output.

FIG. 6E shows a simple alternative embodiment for a single current source output.

FIG. 6F shows a further alternative embodiment with multiple double-ended (source+sink) complementary current outputs.

FIG. 6G shows a further alternative embodiment with multiple double-ended (source+sink) complementary current outputs.

FIGS. 7 to 21 show differential transconductors:

FIG. 7 shows a simple differential transconductor embodiment.

FIG. 8 shows an alternative embodiment which is somewhat similar to that of FIG. 7.

FIG. 9 shows another alternative embodiment which is somewhat similar to that of FIG. 7.

FIG. 10 shows a further alternative embodiment.

FIG. 11 shows another embodiment.

FIG. 12 shows an embodiment similar to that of FIG. 11, with biasing like that of FIGS. 6A and 8.

FIG. 13 shows an embodiment similar to that of FIG. 11, with biasing like that of FIGS. 6B and 9.

FIG. 14 shows yet another embodiment of the differential transconductor.

FIG. 16 shows an alternative embodiment in which the compensating resistor is split, and the compensating resistor and transistor are integrated into the output current mirror.

FIG. 17 shows an embodiment similar to that of FIG. 16, but with emitter resistors to improve matching.

FIG. 18 shows an embodiment which is fairly similar to that of FIG. 16, except that the compensating resistor is bridged.

FIG. 19 shows a simple circuit with no mirrors, in which the compensating resistor is doubled.

FIG. 20 is generally similar to the embodiment of FIG. 19, except that the compensating resistor is bridged and a pair of current mirrors is added.

FIG. 21 is generally similar to the embodiment of FIG. 20, except that a pair of PNP cascode transistors is added.

FIG. 23 shows a 4-quadrant analog multiplier, and

FIG. 24 shows a voltage-controlled variable-gain amplifier.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The innovative current generator of the parent application will first be described, to provide a better understanding of the further innovations described herein.

Current Generator of Parent Application

Figure 1:
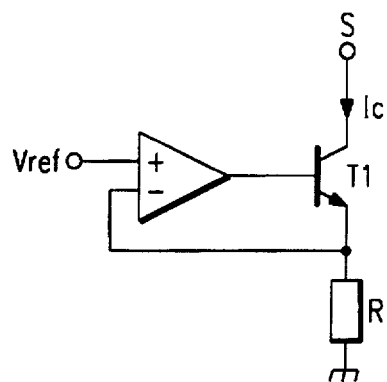
FIG. 1, as described above, shows a conventional precise current generator.
Figure 2:
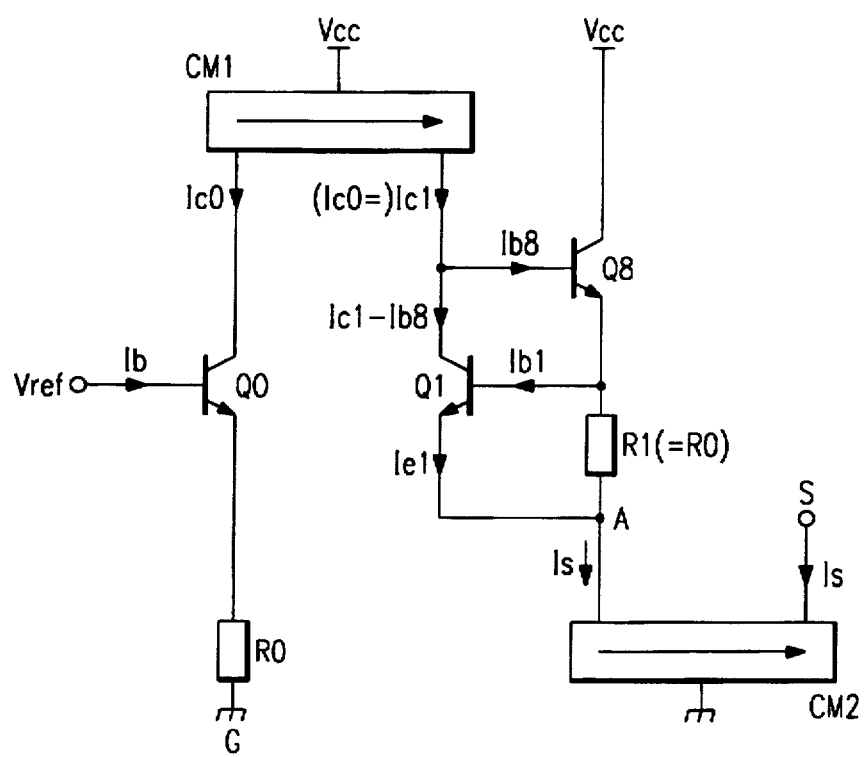
FIGS. 2–4 show three embodiments of precise current generators as disclosed in the parent application.
Figure 3:
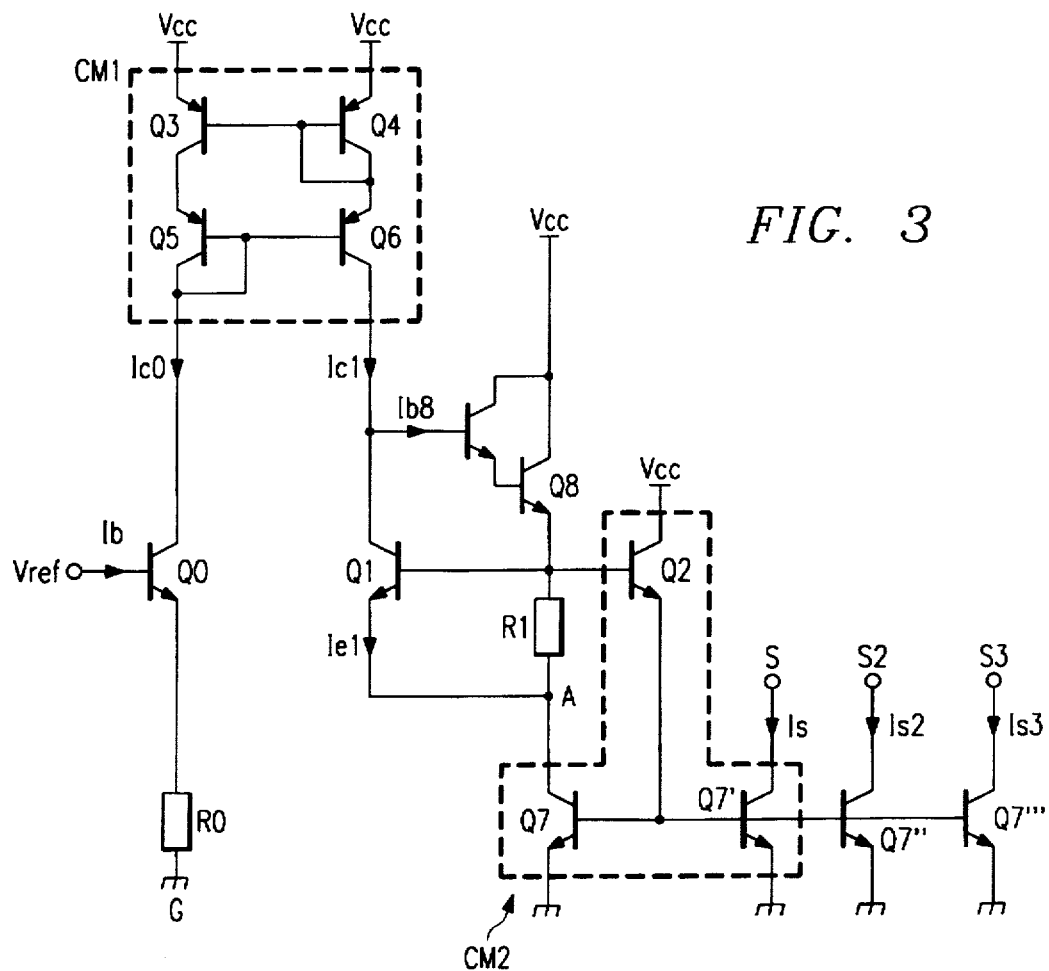
Figure 4:
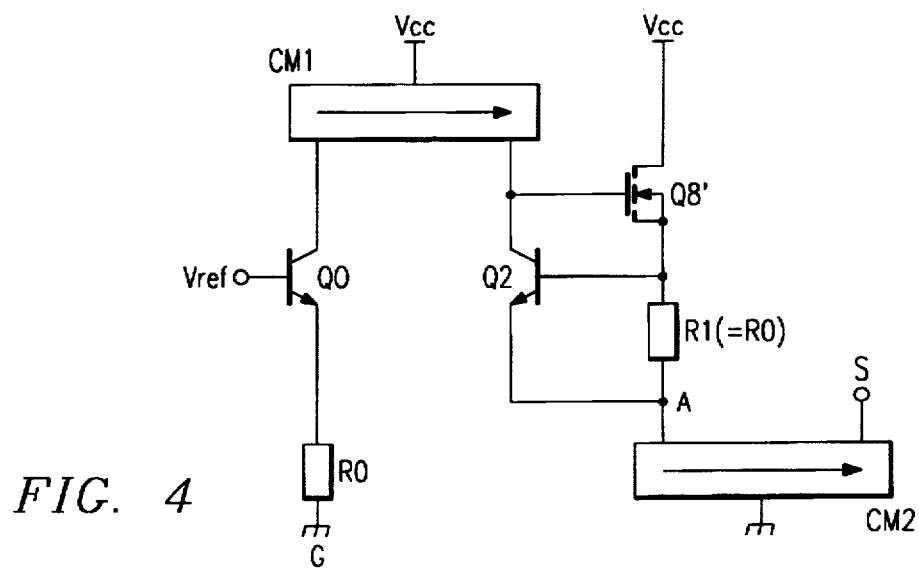

FIG. 1, as described above, shows a conventional circuit for current generator. FIGS. 2–4, showing precise current generators as disclosed in the parent application, will now be described.

In FIG. 2, a reference voltage Vref is applied to the base of a transistor Q0. The emitter of transistor Q0 is connected to ground G through a resistor R0 having a value R. A current mirror CM1, assumed to be ideal, copies current Ic0. The copied current Ic1 is shared into a base current Ib8 of an NPN transistor Q8 and a collector current Ic1–Ib8 of an NPN transistor Q1. Mirror CM1 is connected to a high supply voltage Vcc, and the direction of copy is indicated by an arrow. The collector of transistor Q8 is connected to voltage Vcc, and its emitter is connected to the base of transistor Q1 and to a terminal of a resistor R1 having the same value as resistor R0 (25 KΩ, in the presently preferred embodiment). The other terminal of resistor R1 is connected to a node A to which the emitter of transistor Q1 is connected. Current Is in node A is copied to an output terminal S by a current mirror CM2, assumed to be ideal, connected to ground.

In the following, it is assumed that all the transistors have practically identical characteristics, especially an equal gain $\beta \gg 1$, and the same base-emitter voltage drop Vbe, which is easy to implement in an integrated circuit. Moreover, for convenience in the following calculations, the Vbe of PNPs will often be stated with sign reversed, as will be readily apparent to those of ordinary skill in the art.

With the configuration of FIG. 2, current Ic0 is exactly:

$$Ic0=(Vref-Vbe0)/R0-Ib0,$$

where Ib0 designates the base current of transistor Q0. This base current is:

$$Ib0=Ic0/\beta=(Vref-Vbe0)/\beta R0.$$

Since resistor R1 is positioned between base and emitter of transistor Q1, the current in resistor R1 is Vbe1/R1. This current is provided by transistor Q8, the base current of which, Ib8, is approximately Ib8=Vbe1/$\beta$R1

Since the current flowing through transistor Q1 is close to the current flowing through transistor Q0, the base current of transistor Q1 has substantially the same value Ib1. Also, Vbe1=Vbe0. The emitter current of transistor Q1 is defined by:

$$Ie1=Ic1-Ib8+Ib1.$$

That is, by combining the above equations:

$$Ie1=Vref/R0-Vbe0/R0-Vbe1/\beta R1.$$

Thus, one obtains in node A and at the output of mirror CM2, a current:

$$\begin{aligned} Is &= Ie1 + Vbe1/R1 = Vref/R0 - Vbe1/\beta R1 \\ &= (1 - k/\beta)Vref/R0, \text{ since } R1 = R0 \text{ and } Vbe1 = Vbe0. \end{aligned}$$

where k=Vbe1/Vref.

Thus, the generator according to the invention, shown in FIG. 2, provides a current with substantially the same precision as the current of the conventional generator of FIG. 1, but has the following advantages:

- the generator according to the invention occupies a substantially smaller silicon surface because it is much less complex than an operational amplifier (as seen later on, each current mirror comprises two to four transistors), and because it does not need any compensation capacitor, and
- by selecting an adequate mirror M2, exemplified hereunder, terminal S can be subject to a lower voltage than the minimum value Vcesat+Vref of the generator shown in FIG. 1.

If it is desired to still further increase the precision of the output current Is, the perturbing term k/$\beta$ introduced by current Ib2 has to be decreased or cancelled. This can be achieved, as described in relation with FIG. 3, by replacing the bipolar transistor Q8 with a Darlington transistor or with a MOS transistor (FIG. 4) if available in the manufacturing technology.

FIG. 3 shows in more detail an embodiment of the current generator according to the invention. Elements which are the same as in FIG. 2 are designated with the same references. In addition to the current output terminal S, this embodiment comprises two additional terminals S2 and S3.

Mirror CM1, in the presently preferred embodiment, is a conventional bipolar transistor mirror of the Wilson-type (which provides nearly ideal characteristics). The mirror comprises two PNP transistors Q3, Q5 in series between the collector of transistor Q0 and supply voltage Vcc, and two additional PNP transistors Q4, Q6 in series between the collector of transistor Q1 and supply voltage Vcc. The input of mirror CM1 corresponds to the shorted base-collector of transistor Q5. The mirror output corresponds to the collector of transistor Q6, the base of which is connected to the base of transistor Q5. The collector and base of transistor Q4 are shorted and connected to the base of transistor Q3.

Mirror CM2 comprises two NPN transistors Q7 and Q7', having emitters connected to ground and bases interconnected. The collector of transistor Q7' forms the mirror input and is connected to the node A. The collector of transistor Q7' forms the mirror output and is connected to terminal S. Additional transistors may be connected in parallel to Q7', as shown, to provide additional current output terminals S2, S3, etc. The base current of transistors Q7' is provided by the emitter of an NPN transistor Q2, the collector of which is connected to the supply voltage Vcc, and the base of which is connected to the emitter of transistor Q8'. The base current consumed by transistor Q2 is supplied by Q8, which renders this mirror close to ideal. Of course, other current mirror circuits can be used; see generally section 2.12 of Feucht, HANDBOOK OF ANALOG CIRCUIT DESIGN (1990), which is hereby incorporated by reference.

With this configuration (and with all transistors having the same gain $\beta$), collector currents Is2 and Is3 will be equal to current Is, that is, Vref/R if Q8 is a Darlington transistor. By designing the area of transistors Q7" and Q7'" to be different from that of Q7', it is possible to obtain output currents Is2 and Is3 which are predetermined fractions or multiples of current Is. Of course, additional transistors can be connected in parallel to increase the number of current outputs.

With current mirror CM2, the minimum voltage at terminals S, S2 and S3 is equal to voltage Vcesat of transistors Q7'–Q7"', that is, approximately 0.3 volt (instead of Vcesat+Vref in the prior art generator).

FIG. 4 illustrates an embodiment in BiCMOS technology of a generator according to the invention. Elements which are the same as in FIG. 2 are designated with the same references. Transistor Q8 is replaced by an N-channel MOS transistor Q8', with a resulting null current Ib8 and a current Is strictly equal to Vref/R.

In a sample preferred embodiment, the specific parameters used are: Vref=1.2 V; $\beta$=90; R0=R1=25 K$\Omega$; and Q0 has the minimum emitter area for the process used. However, as will be readily recognized by those of ordinary skill in the art, these specific parameters are not necessary for use of the claimed innovations, and can be readily varied. For example, most of the disclosed circuits will still work for betas of 30 or less.

Innovative Single-Ended Transconductor Embodiments

For clarity, the innovative single-ended transconductors will be described first, followed by the differential transconductor embodiments which would be more likely to be used in a sample embodiment.

FIGS. 5 and 6A–6G show single-ended (in and out) transconductors according to various embodiments of the inventions. Note that, even where reference numbers may be the same as those of FIGS. 1–4, these reference numbers do not necessarily indicate identical or corresponding elements.

Figure 5:
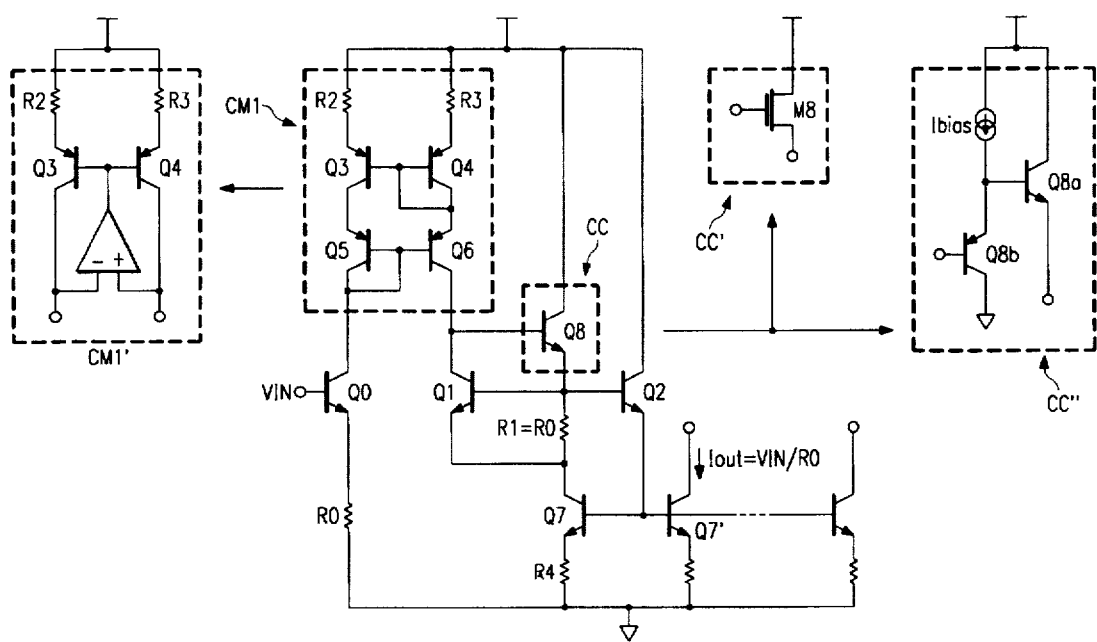
FIGS. 5 and 6A–6G show single-ended (in and out) transconductors according to various embodiments of the inventions.

FIG. 5 shows a basic sample circuit configuration. Note that this configuration includes a few possible substitutions: the compensation-current block CC, which is primarily implemented by transistor Q8, may be replaced by block CC' (with NMOS transistor M8) or block CC" (a folded-Darlington configuration), to achieve a base-current-independent output.

In another illustrated alternative, mirror CM1 (using PNPs Q3–Q6) may be replaced by a low-drop-in mirror CM1' with a one-stage amplifier and bootstrapped input resistance, for low-supply implementations. These particular modifications can also be introduced into most of the other embodiments shown.

Along the lines of the foregoing analysis of FIGS. 2 and 3, it may be seen that (Neglecting the base current of Q8): Iout=Vin/R0, which is a linear transconductance relation.

Figure 6A:
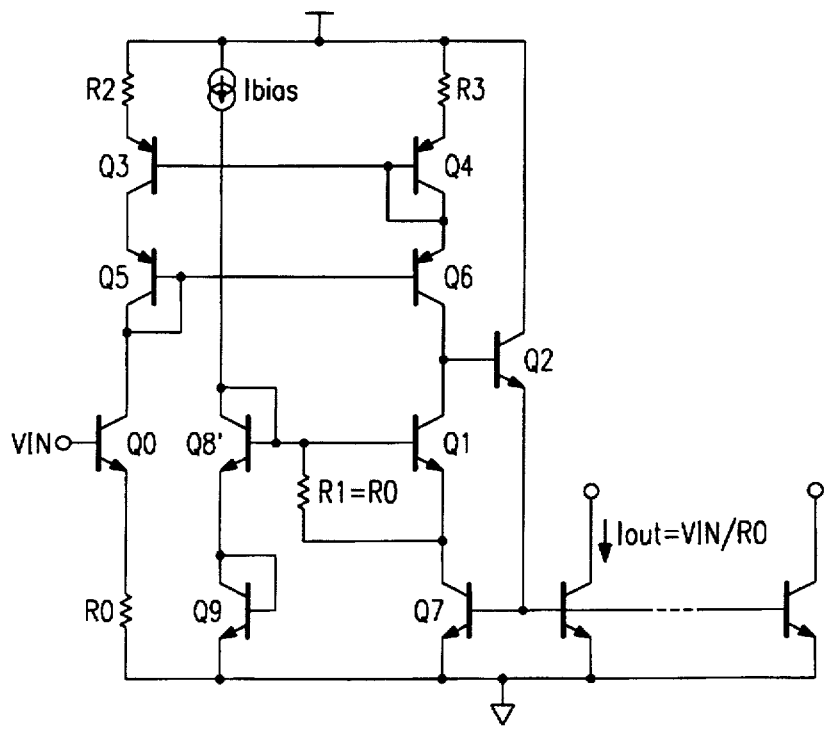

FIG. 6A shows a modification of the circuit of FIG. 5, which does not require a Darlington. Instead, transistor Q8' is connected base-to-base with Q1. Transistors Q8' and Q9, with current source Ibias, thus provide the Vbe1/R1 current to the output. This configuration works under lower supply voltages than the configuration of FIG. 5, since the collector of Q6 is now only at 2Vbe above Vss.

Figure 6B:
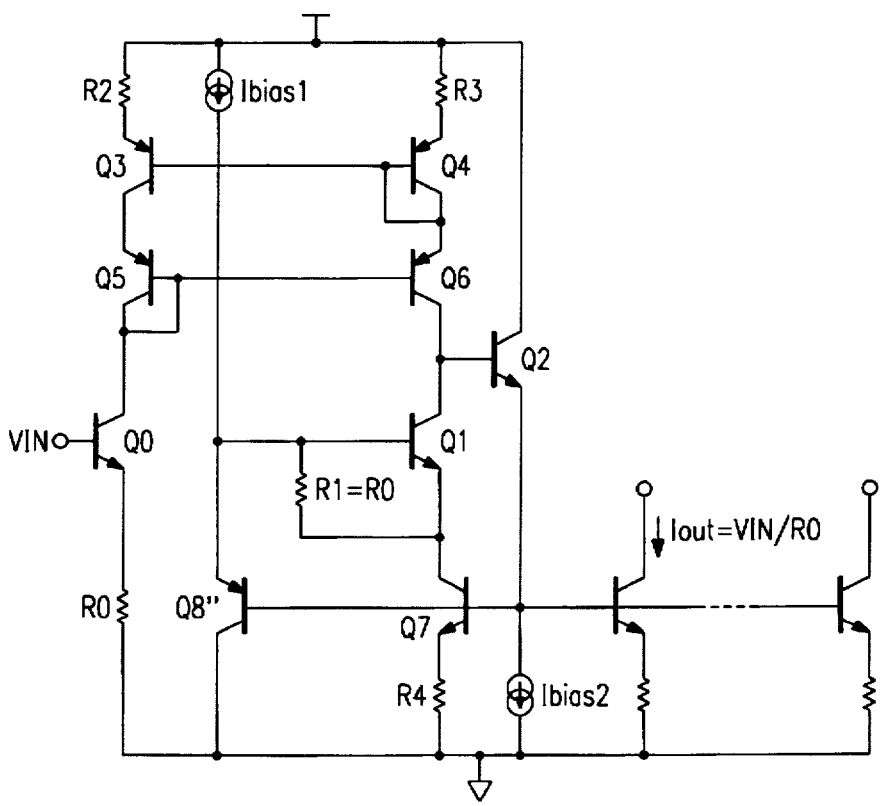

FIG. 6B shows another variation where the emitters of the output transistors are degenerated for improved current matching. The base of Q1 is now biased by the emitter of PNP Q8". This embodiment provides similar advantages, over the embodiment of FIG. 5, as does the embodiment of FIG. 6A.

Figure 6C:
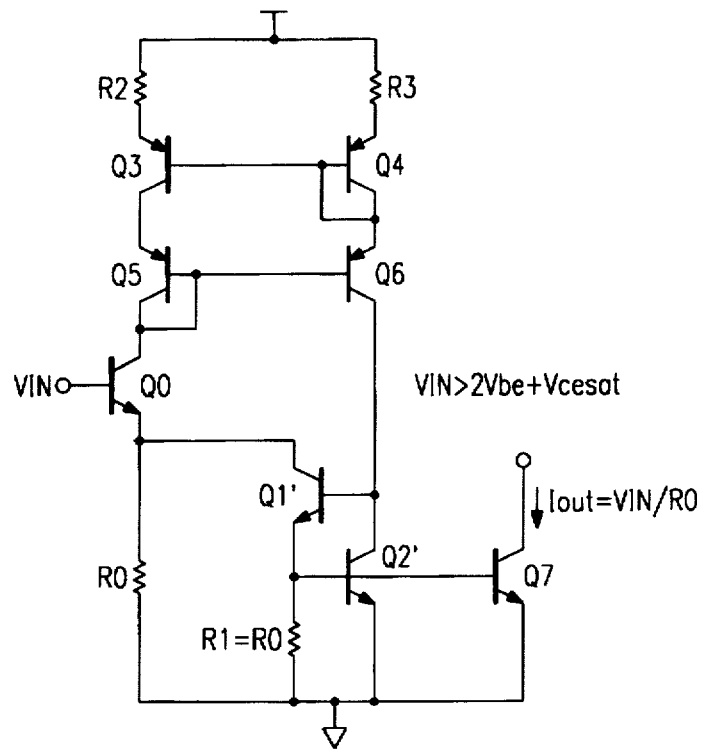

FIG. 6C shows a simplified circuit for the case where only one output is desired and VIN is larger than 2Vbe+Vcesat. The current through Q0 is:

$$I0 = (VIN - Vbe_0)/R0 + I1 - Ib_0.$$
With
$$I1 = Vbe_7/R1 + 2Ib_7 = Vbe_0/R0 + 2Ib_0,$$
it may be seen that
$$I0 = VIN/R0 + Ib_0.$$

I0 is then directly equal to the desired value of Iout, with only one base current error (if $Ib_1$ is not neglected, this error is attenuated).

Figure 6D:
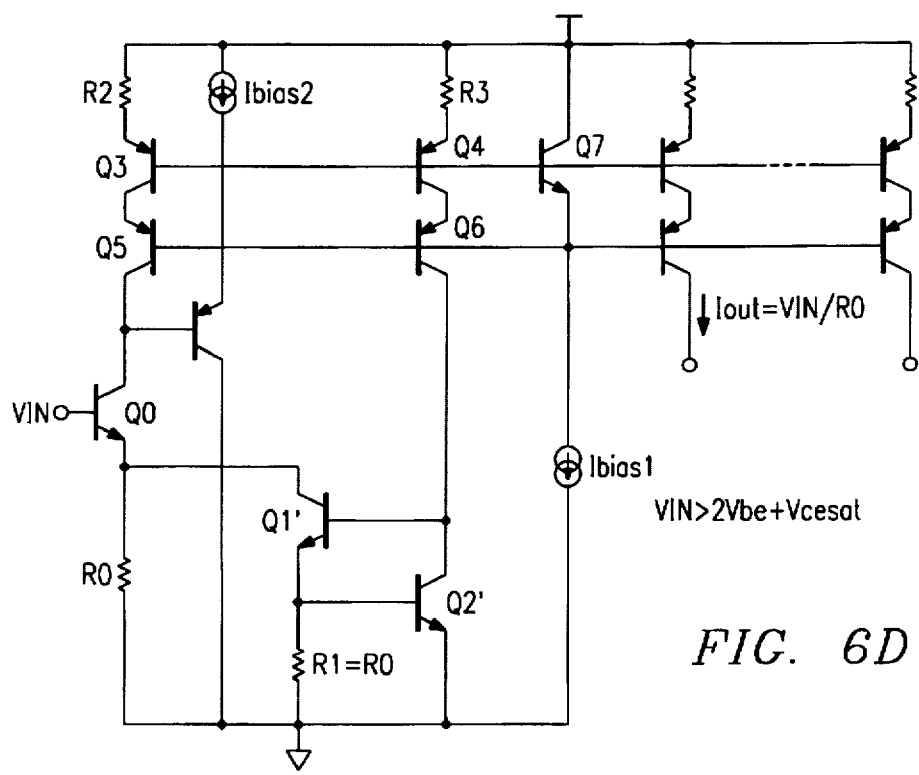

FIG. 6D is the same as FIG. 6C, except with a multiple current sink output. In this embodiment:

$$I0 = (VIN - Vbe_0)/R0 + I1 - Ib_0,$$
$$I1 = Vbe_0/R0 + Ib_0$$
(with $Ib_1$ neglected) and hence
$$I0 = Iout = VIN/R0.$$

Note that the circuit embodiments of FIGS. 6C and 6D provide compensation in a rather different way than most of the other embodiments do. In these embodiments, distortion cancellation is performed at the emitter of the input transistor, i.e. "before" the distortion actually occurs, so that the current through the input transistor is not distorted at all. (By contrast, in most of the other disclosed embodiments, the distortion is cancelled "after" it occurs.) However, the embodiments of FIGS. 6C and 6D are slightly less accurate, because of residual base current effects.

Figure 6E:
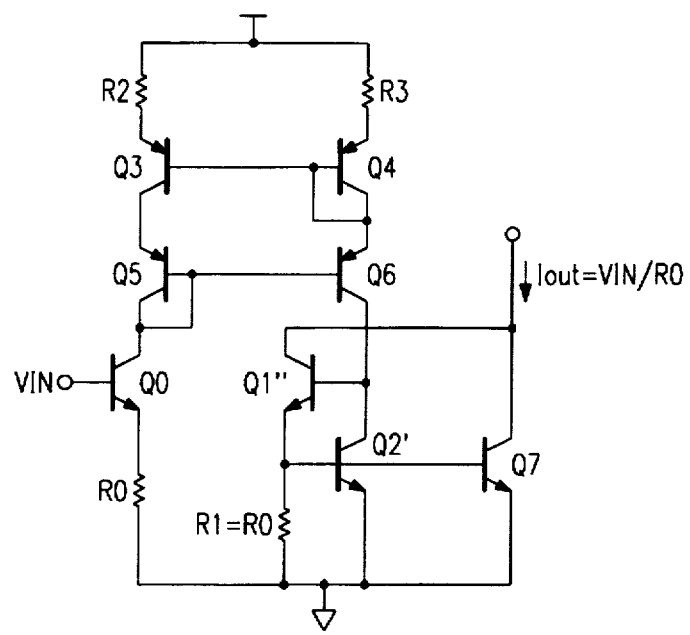

FIG. 6E shows an alternative embodiment for a single current source output. The condition VIN>2Vbe+Vcesat is removed, but the voltage on the output node must still be higher than Vbe+Vcesat. The key advantage of this embodiment is its simplicity.

Figure 6F:
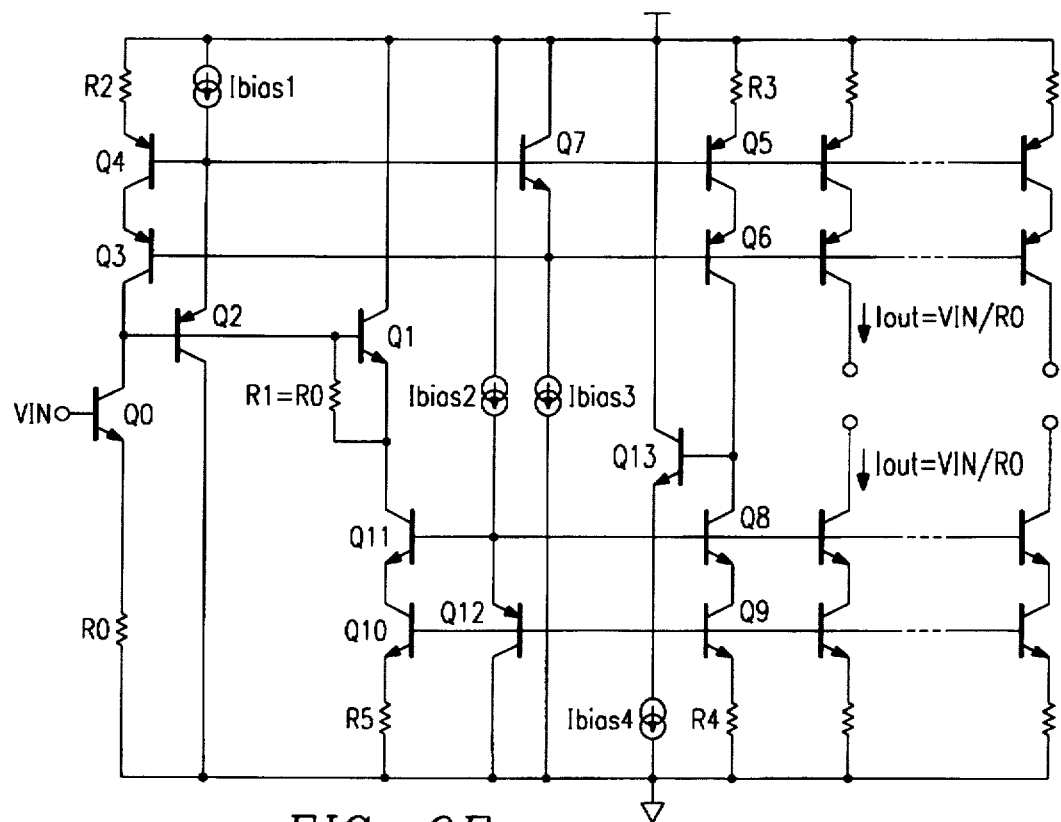

FIG. 6F shows a further alternative embodiment with multiple double-ended (source+sink) complementary current outputs. In this Figure, Q13 is the base current compensating device for the NPN mirror (input Q8, output Q11), like Q2 for the PNP mirror (input Q3, output Q6).

Figure 6G:
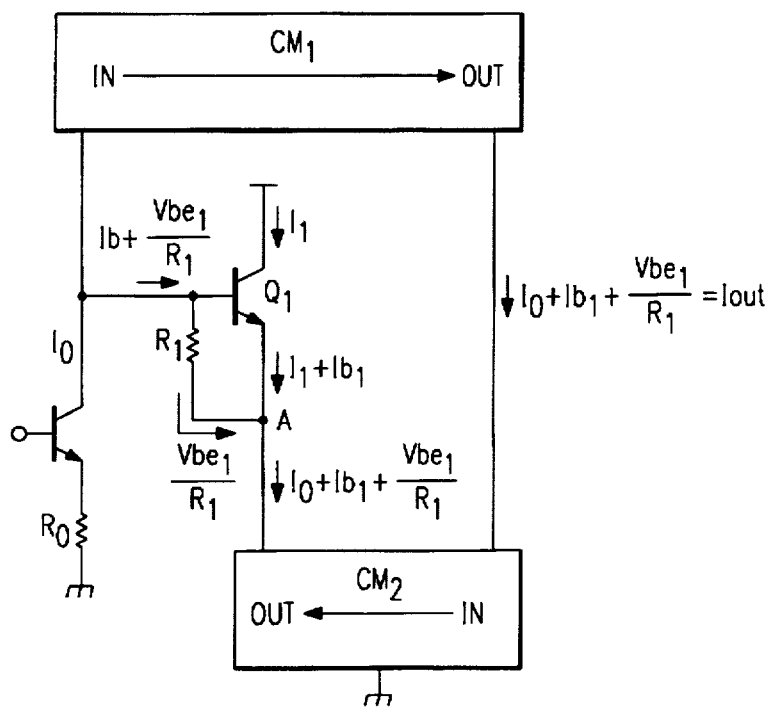

FIG. 6G shows a simplified circuit which is useful in understanding the operation of FIG. 6F (and of other circuits): in this circuit, input transistor $Q_0$ and resistor $R_0$ are connected as above. The collector current of Q0 is combined with a branch, formed by Q1 and R1, which adds current components $Ib_1$ and Vbe/R1. Thus the current mirrored through PNP mirror CM1 is $$I_0+Ib_1+Vbe_1/R1.$$

This current is mirrored back through NPN mirror CM2 to provide the proper bias current for Q1. Now, since the collector currents I0 and I1 of matched transistors Q0 and Q1 are equal, their Vbe's and Ib's are also equal as desired.

Innovative Differential Transconductor Embodiments

FIGS. 7 to 20 show differential transconductors. In these figures, VIN and Iout are implemented as differentials:

$$VIN = V+ - V-.$$
$$Iout = I_+ - I_-.$$

Figure 7:
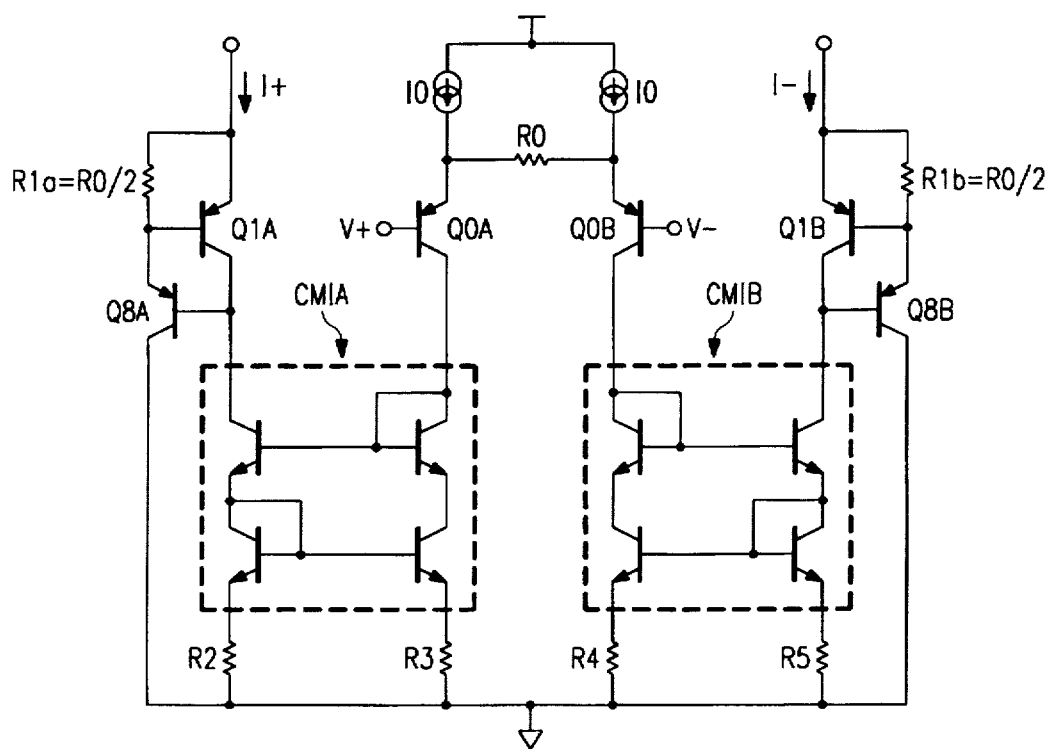

The following embodiments all show PNP input transistors, but of course these could be configured with NPN input pairs instead. FIG. 7 shows a simple differential transconductor embodiment, in which the differential inputs + and − are applied to PNP input transistors Q0A and Q0B, whose emitters are bridged by reference resistor R0. The currents passed by the input transistors are mirrored through current mirrors CM1A and CM1B, over to two output branches. Each branch includes a compensation transistor Q1A or Q1B, and a compensating resistor R1A or R1B, and also (in this embodiment) a base current compensation transistor Q8A or Q8B. Note that this embodiment does not include any analog to the second current mirror CM2 of FIG. 2, but of course such could be added if desired.

In this embodiment, it may be seen that $$I_{0A} = I0 + ((V- + Vbe_{0B}) - (V+ + Vbe_{0A}))/R0 - Ib_{0A}$$
$$= I0 + (Vbe_{0B} - Vbe_{0A} - VIN)/R0 - Ib_{0A}.$$

$$I_{0B} = I0 + (Vbe_{0A} - Vbe_{0B} + VIN)/R0 - Ib_{0B}.$$
Neglecting $Ib_{8A}$ and $Ib_{8B}$, we have:

$$I_+ = I_{0A} + Ib_{1A} + 2Vbe_{1A}/R0$$
$$= I_{0A} + Ib_{0A} + 2Vbe_{0A}/R0$$

since $I_{1A} = I_{0A}$.
Hence,
$$I_+ = I0 + (Vbe_{0B} + Vbe_{0A} - VIN)/R0.$$

$$I_- = I_{0B} + Ib_{0B} + 2Vbe_{0B}/R0.$$
Hence,
$$I_- = I0 + (Vbe_{0A} + Vbe_{0B} + VIN)/R0.$$
Hence Iout $= -2Vin/R0$,
giving a linear relationship as desired. However, it should be noted that
$$I_+ + I_- = 2I0 + 2(Vbe_{0A} + Vbe_{0B})/R0,$$
so that only the differential output is linear with VIN.

Figure 8:
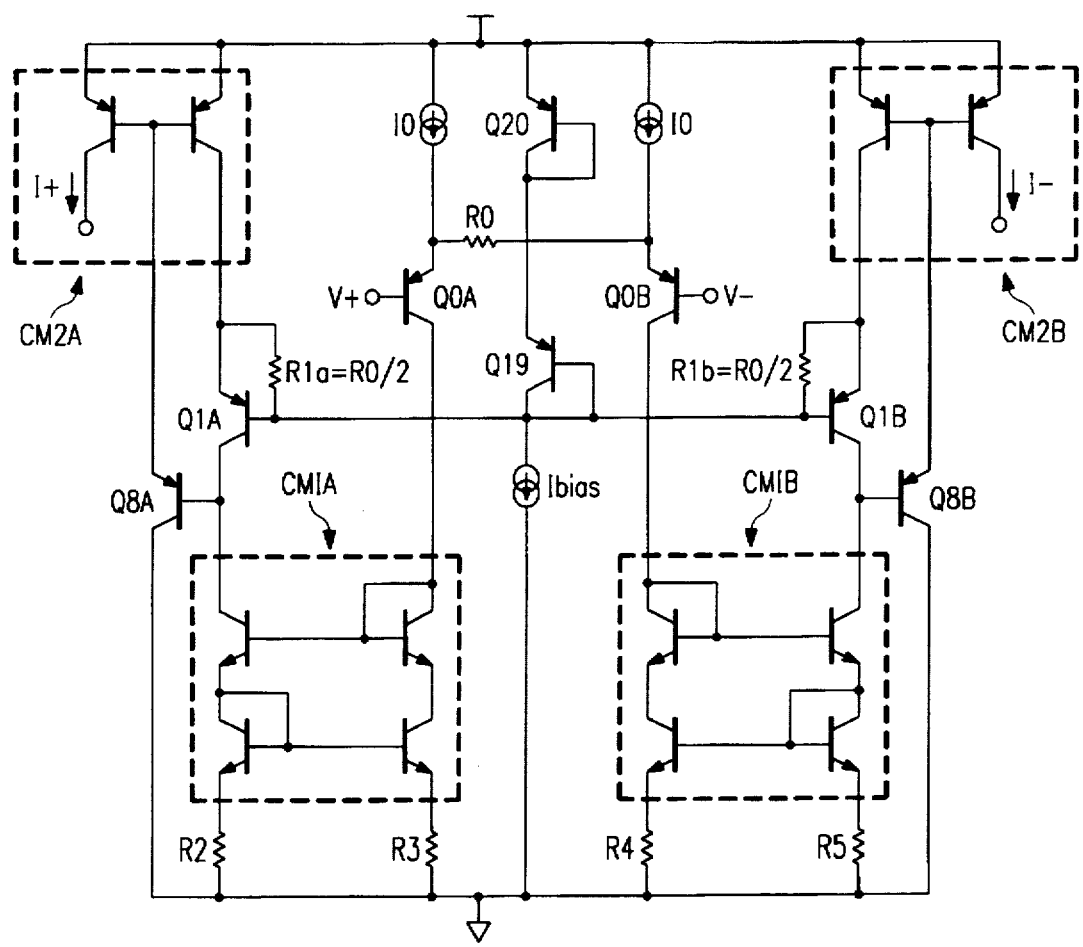

FIG. 8 shows an alternative embodiment which is similar to that of FIG. 7, with biasing of the bases of Q1A and Q1B similar to FIG. 6A. Note that this embodiment also includes the second mirror CM2.

Figure 9:
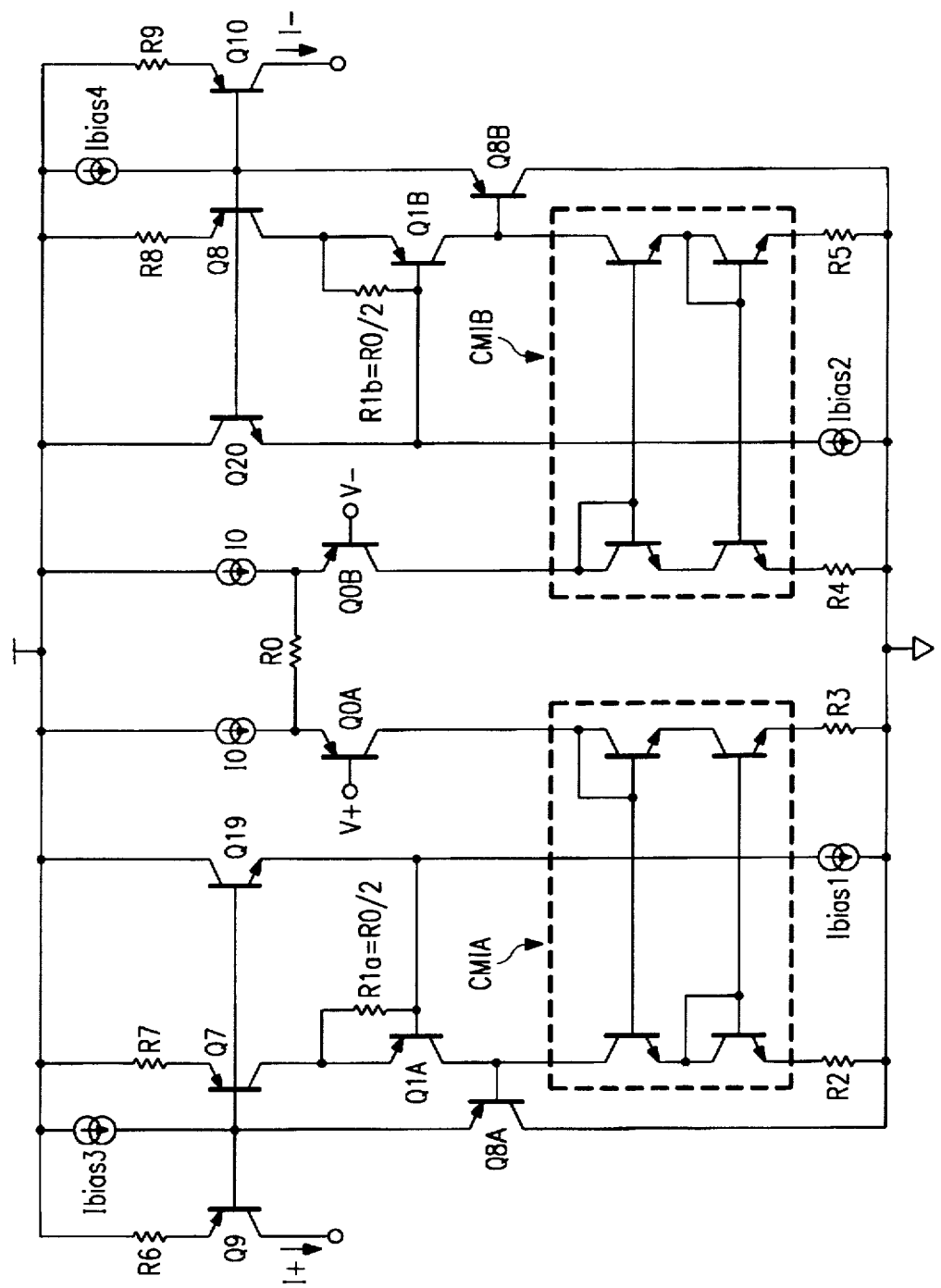

FIG. 9 shows an alternative embodiment which is similar to that of FIG. 7 again, with biasing similar to FIG. 6B.

Figure 10:
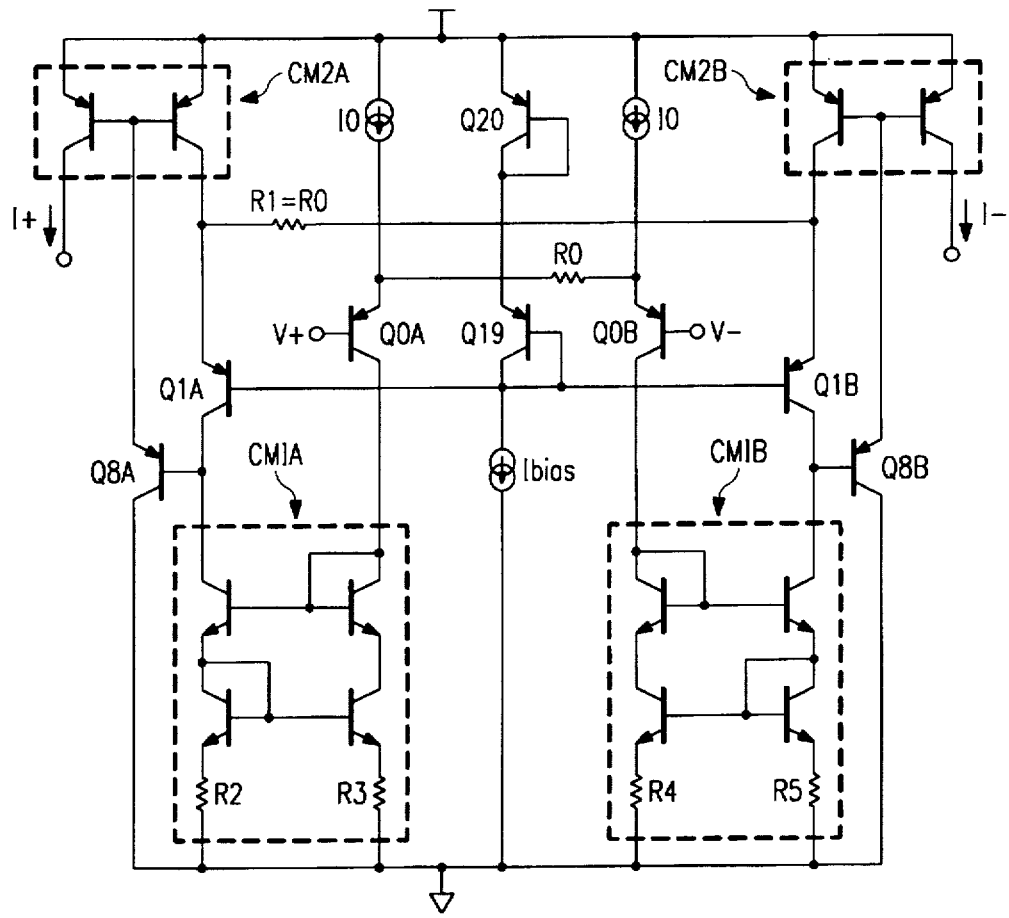

FIG. 10 shows a further alternative embodiment, in which R1 is bridged, and a second current mirror CM2 is used, and transistors Q19 and Q20 provide base current compensation. In this embodiment, $$I_{0A} = I0 + (Vbe_{0B} - Vbe_{0A} - VIN)/R0 - Ib_{0A}.$$
$$I_{0B} = I0 + (Vbe_{0A} - Vbe_{0B} + VIN)/R0 - Ib_{0B}.$$

$$I_+ = I_{0A} + Ib_{0A} + (Vbe_{1A} - Vbe_{1B})/R1$$
$$= I_{0A} + Ib_{0A} + (Vbe_{0A} - Vbe_{0B})/R0.$$
$$= I0 - VIN/R0.$$

-continued $$I_- = I_{OB} + Ib_{OB} + (Vbe_{OB} - Vbe_{OA})/R0.$$
$$= I0 + VIN/R0$$
$$Iout = -2VIN/R0.$$

Figure 11:
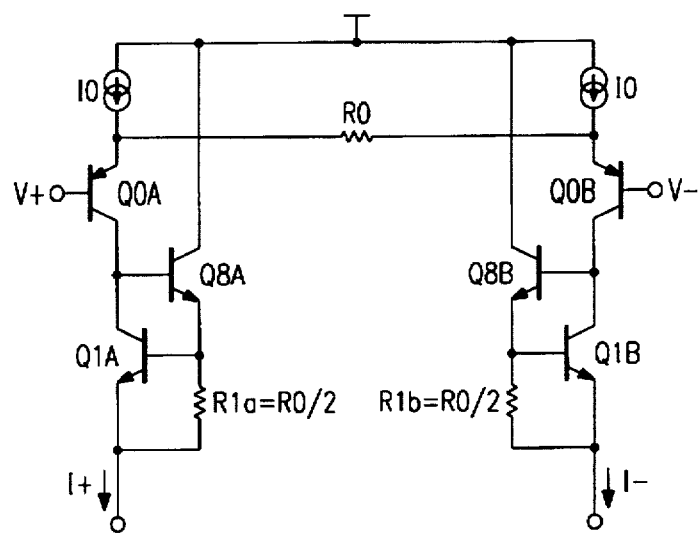

FIG. 11 shows another embodiment, in which R1 is split into two resistors R1$a$ and R1$b$, and which includes NO current mirrors: instead, the innovative current compensation is introduced into the same leg as each input transistor. In this embodiment it may be seen that $$I_{OA} = I0 + (Vbe_{OB} - Vbe_{OA} - VIN)/R0 - Ib_{OA}.$$

$$I_{OB} = I0 + (Vbe_{OA} - Vbe_{OB} + VIN)/R0 - Ib_{OB}.$$

Neglecting $Ib_{8A}$ and $Ib_{8B}$:

$$I_+ = I_{OA} + Ib_{1A} + 2Vbe_{1A}/R0 = I0 + Ib_{1A} - Ib_{OA} + (Vbe_{OB} -$$

$$Vbe_{OA} + 2Vbe_{1A} - VIN)/R0.$$

$$I_- = I_{OB} + Ib_{1B} + 2Vbe_{1B}/R0$$
$$= I0 + Ib_{1B} - Ib_{OB} + (Vbe_{OA} - Vbe_{OB} + 2Vbe_{1B} + VIN)/R0.$$

Hence $$I \text{ out} = (Ib_{1A} - Ib_{OA}) +$$
$$(Ib_{OB} - Ib_{1B}) + 2(Vbe_{OB} - Vbe_{OA} + Vbe_{1A} - Vbe_{1B} - VIN)/R0.$$

However, $$I_{OA} - = IS_P \cdot \exp(Vbe_{OA}/Vt),$$

and $$I1A = IS_N \cdot \exp(Vbe_{1A}/Vt),$$

so that $$Vbe_{1A} - Vbe_{OA} = Vt \log(IsP/IsN) = \text{constant}.$$

($IS_N$ and $IS_P$ are the base-emitter diode saturation currents for the NPN and PNP transistors, all constant on the same die). Therefore:

$$Vbe_{1A} - Vbe_{OA} = Vbe_{1B} - Vbe_{OB} = \text{constant},$$

or equivalently $$Vbe_{OB} - Vbe_{OA} + Vbe_{1A} - Vbe_{1B} = 0.$$

It may be seen that $$Iout = -2VIN/R0$$

(with the approximation $Ib_{OA} = Ib_{1A}$ and $Ib_{OB} = Ib_{1B}$). But $$I_+ + I_- = 2I0 + 2(Vbe_{1A} Vbe_{1B})/R0.$$

Thus, in this embodiment only the differential output is linear with VIN.

Figure 12:
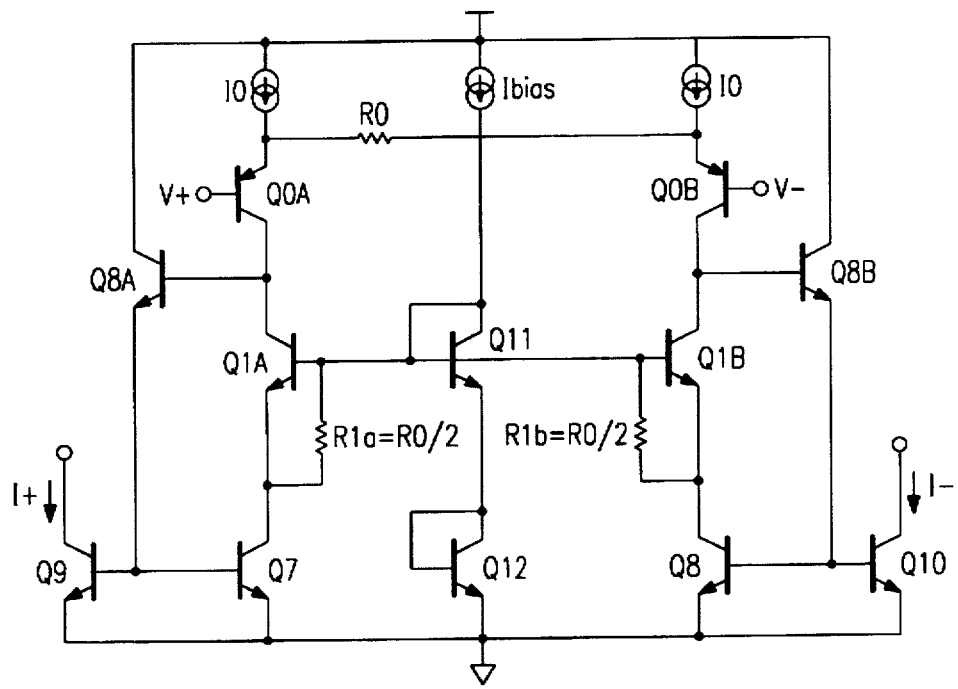
Figure 13:
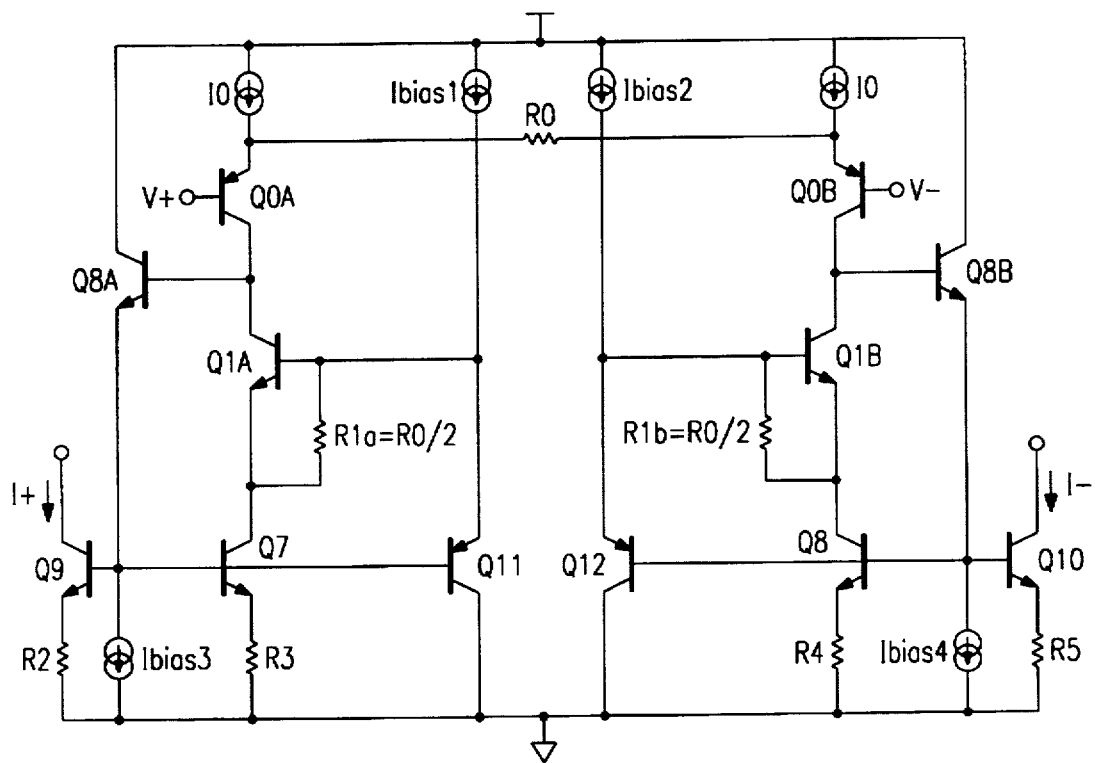

FIG. 12 shows an embodiment similar to that of FIG. 11, with biasing like that of FIGS. 6A and 8. FIG. 13 shows an embodiment similar to that of FIG. 11, with biasing like that of FIGS. 6B and 9.

Figure 14:
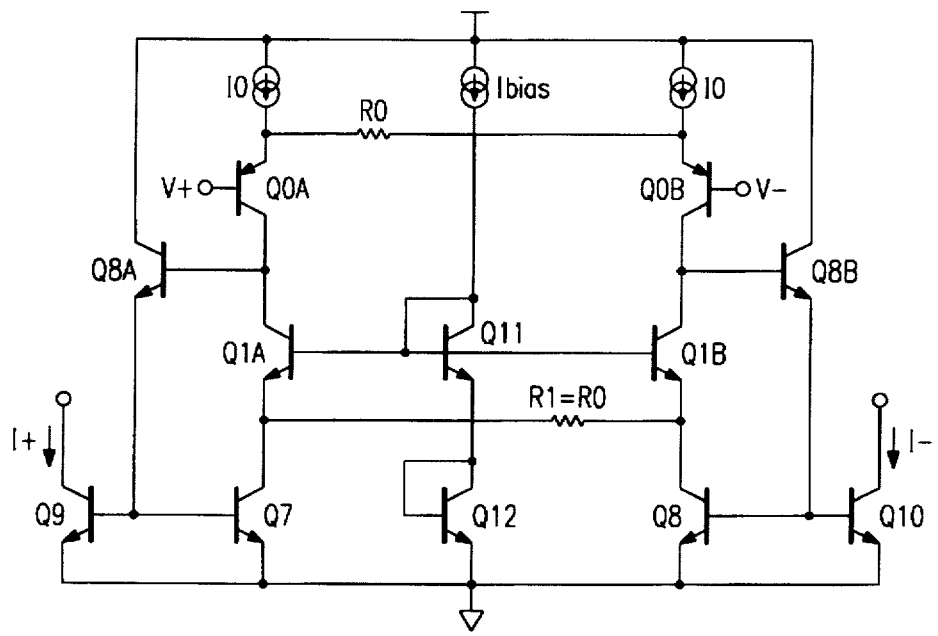

FIG. 14 shows yet another embodiment of the differential transconductor. Q11 provides biasing to the bases of Q1A and Q1B. Note that both R1 and R0 are connected as bridge resistors. In this Figure, it may be seen that $$I_{OA} = I0 + (Vbe_{OB} - Vbe_{OA} - VIN)/R0 - Ib_{OA}.$$

$$I_{OB} = I0 + (Vbe_{OA} - Vbe_{OB} + VIN)/R0 - Ib_{OB}.$$

-continued $$I_+ = I_{OA} + Ib_{1A} + (Vbe_{1A} - Vbe_{1B})/R0$$
$$= I0 + Ib_{1A} - Ib_{OA} + (Vbe_{OB} - Vbe_{OA} + Vbe_{1A} - Vbe_{1B} - VIN)/R0.$$
$$= I0 - VIN/R0.$$

$$I_- = I_{OB} + Ib_{1B} + (Vbe_{1B} - Vbe_{1A})/R0$$
$$= I0 + Ib_{1B} - Ib_{OB} + (Vbe_{OA} - Vbe_{OB} + Vbe_{1B} - Vbe_{1A} + VIN)/R0.$$
$$= I0 + VIN/R0.$$

$$Iout = -2VIN/R0;$$

$$I_+ + I_- = 2I0.$$

Thus in this embodiment both differential and single-ended outputs are linearized.

Figure 15A:
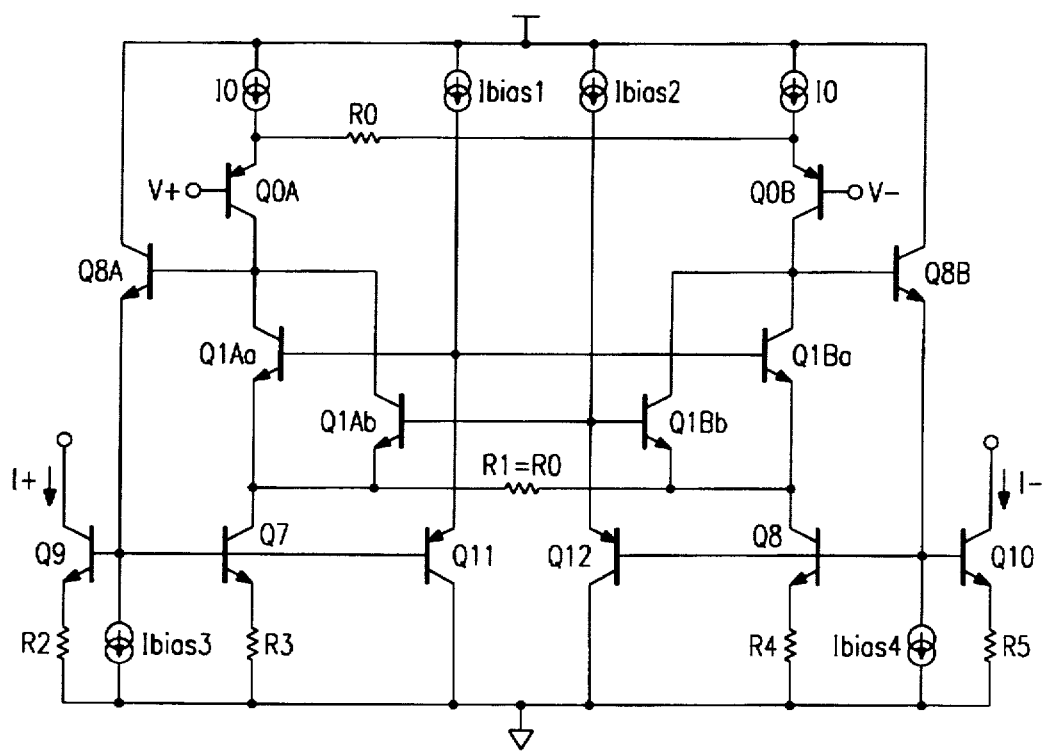
FIGS. 15A and 15B are similar to FIG. 14, but with emitter degeneration resistors added to minimize offset.
Figure 15B:
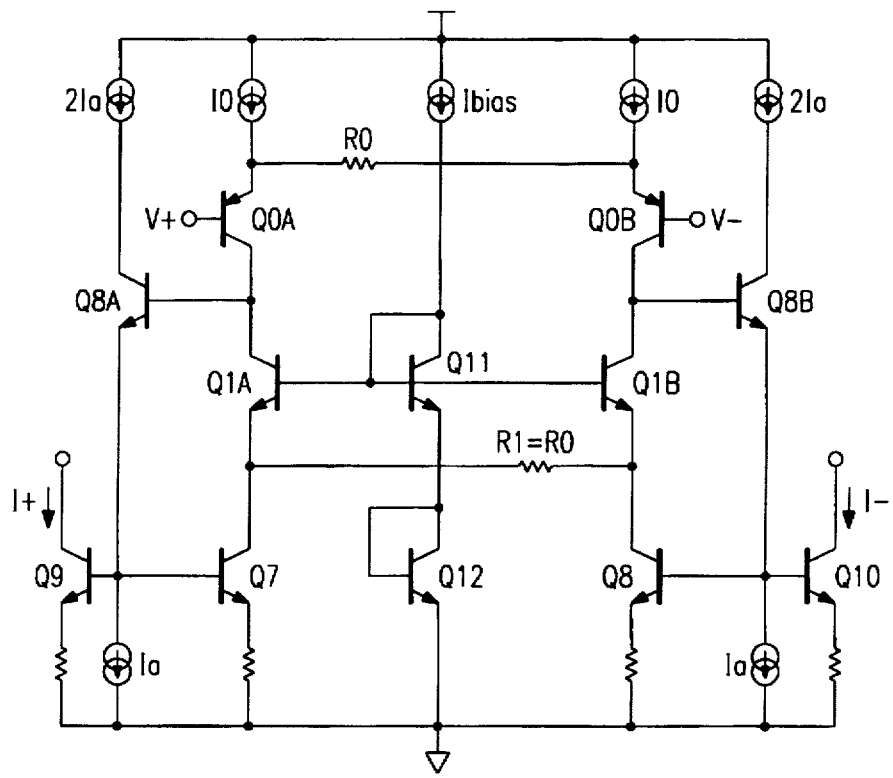

FIGS. 15A & B are similar to FIG. 14, but with emitter degeneration resistors added to minimize offset. In FIG. 15A, the bases of Q1A$a/b$ and Q1B$a/b$ are biased by the emitters of Q11 and Q12. Q1A$a/b$ and Q1B$a/b$ are equivalent to two transistors of equal size, which varies with the input but remains in a constant ratio to that of Q1 and Q2. The quantity Vbe$_{1A}$–Vbe$_{OA}$ is no longer Vt· log (IsP/IsN), but remains always equal to Vbe$_{1B}$–Vbe$_{OB}$ so that the equations of FIG. 14 are still valid. In FIG. 15B, saturation of transistors Q7 and Q8 is avoided by the use of additional current sources Ia and 2 Ia.

Figure 16:
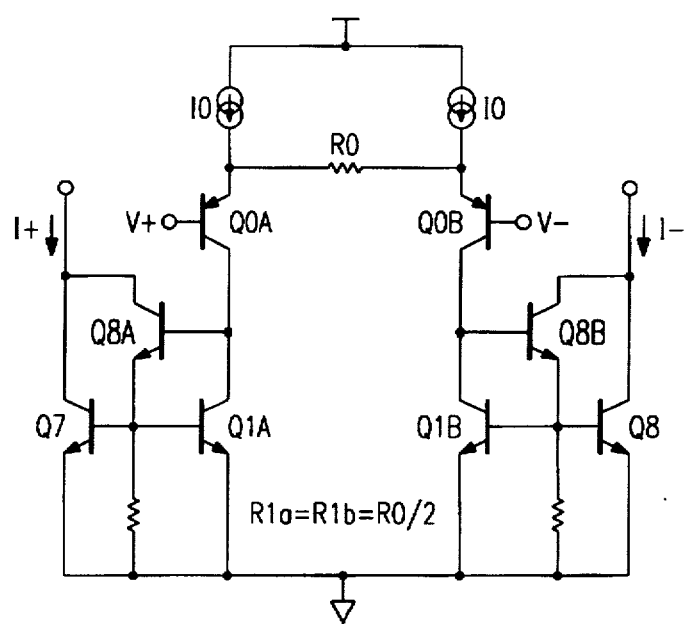

FIG. 16. shows an alternative embodiment in which the compensating resistor R1 is split, and the compensating resistor and transistor are integrated into the output current mirror (so that a corresponding current component is fed directly into the output Current). In this embodiment $$I_{OA} = I0 + (Vbe_{OB} - Vbe_{OA} - VIN)/R0 - Ib_{OA}.$$

$$I_{OB} = I0 + (Vbe_{OA} - Vbe_{OB} + VIN)/R0 - Ib_{OB}.$$

Neglecting $Ib_{8A}$ and $Ib_{8B}$:

$$I_+ = I_{OA} + I_{8A} \text{ and}$$

$$I_- = I_{OB} + I_{8B}:$$

$$I_+ = I_{OA} + 2Ib_{1A} + 2Vbe_{1A}/R0$$
$$= I0 + 2Ib_{1A} - Ib_{OA} + (Vbe_{OB} - Vbe_{OA} + 2Vbe_{1A} - VIN)/R0.$$

$$I_- = I_{OB} + 2Ib_{1B} + 2Vbe_{1B}/R0$$
$$= I0 + 2Ib_{1B} - Ib_{OB} + (Vbe_{OA} - Vbe_{OB} + 2Vbe_{1B} + VIN)/R0.$$

$$Iout = (2Ib_{1A} - Ib_{OA}) + (Ib_{OB} - 2Ib_{1B}) +$$
$$2(Vbe_{OB} - Vbe_{OA} + Vbe_{1A} - Vbe_{1B} - VIN)/R0.$$
$$= -2VIN/R0 + Ib_{1A} - Ib_{1B}.$$

$$I_+ + I_- = 2I0 + 2(Vbe_{1A} + Vbe_{1B})/R0 + Ib_{1A} + Ib_{1B}.$$

Hence in this embodiment only the differential output is linear with VIN.

Figure 17:
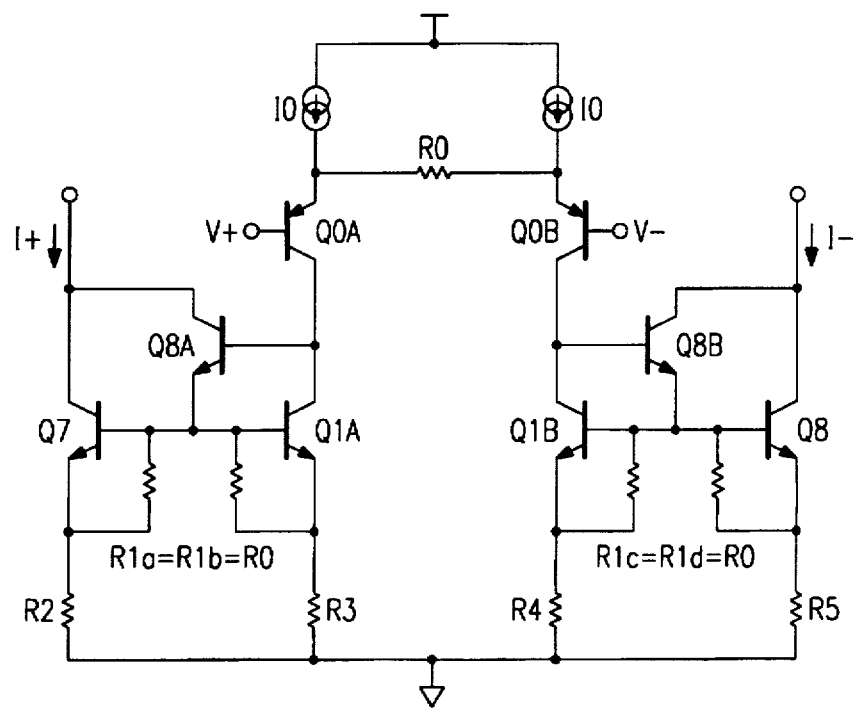

FIG. 17 shows an embodiment similar to that of FIG. 16, but with emitter resistors to improve matching.

Figure 18:
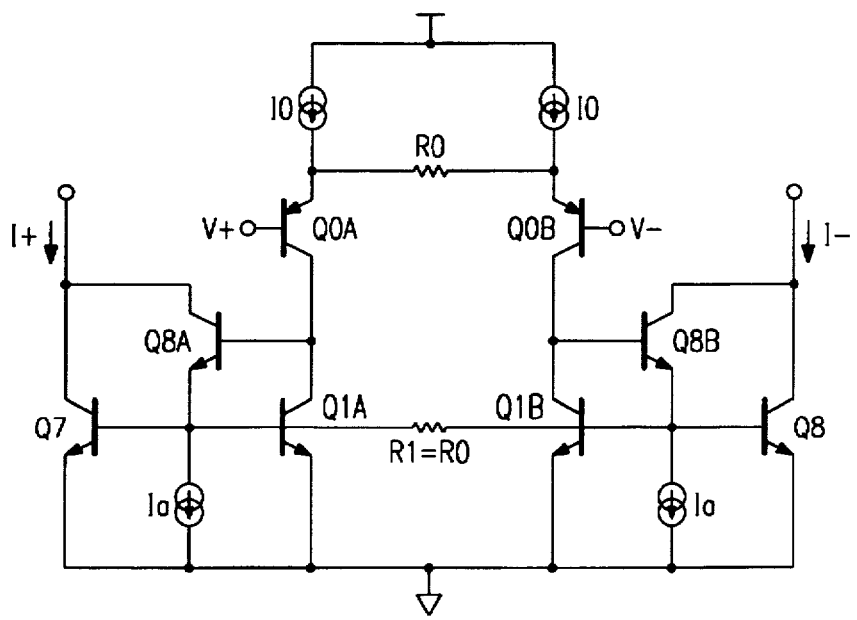

FIG. 18 shows an embodiment which is fairly similar to that of FIG. 16, except that resistor R1 is bridged. In this embodiment $$I_{OA} = I0 + (Vbe_{OB} - Vbe_{OA} - VIN)/R0 - Ib_{OA}.$$

-continued $I_{OB} = I0 + (Vbe_{OA} - Vbe_{OB} + VIN)/R0 - Ib_{OB}$.

Neglecting $Ib_{8A}$ and $Ib_{8B}$:

$$\begin{aligned}
I_+ &= I_{OA} + I_{8A} \\
&= I_{OA} + 2Ib_{1A} + (Vbe_{1A} - Vbe_{1B})/R0 + Ia \\
&= I0 + Ia + 2Ib_{1A} - Ib_{OA} + \\
&\quad (Vbe_{OB} - Vbe_{OA} + Vbe_{1A} - Vbe_{1B} - VIN)/R0 \\
&= I0 + Ia - VIN/R0 + Ib_{1A}.
\end{aligned}$$

$$\begin{aligned}
I_- &= I_{OB} + I_{8B} \\
&= I_{OB} + 2Ib_{1B} + (Vbe_{1B} - Vbe_{1A})/R0 + Ia - I0 + Ia + 2Ib_{1B} - \\
&\quad Ib_{OB} + (Vbe_{OA} - Vbe_{OB} + Vbe_{1B} - Vbe_{1A} + VIN)/R0 \\
&= I0 + Ia + VIN/R0 + Ib_{1B}.
\end{aligned}$$

Hence:

$Iout = -2VIN/R0 + Ib_{1A} - Ib_{1B}$;

$I_+ + I_- = 2I0 + 2Ia + Ib_{1A} + Ib_{1B}$.

Thus in this embodiment both differential and single-ended outputs are linearized.

Figure 19:
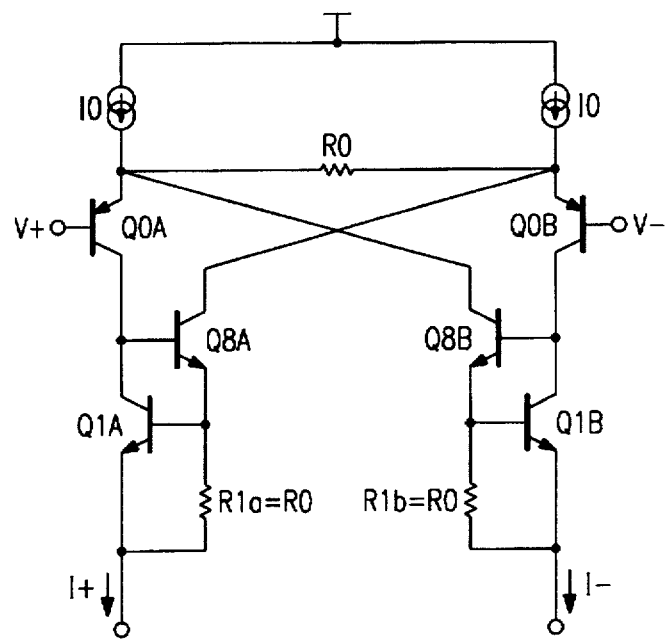

FIG. 19 shows a simple circuit with no mirrors, in which R1 is doubled. In this embodiment (neglecting $Ib_{8A}$ and $Ib_{8B}$):

$I_{OA} = I0 + (Vbe_{OB} - Vbe_{OA} - VIN)/R0 - Ib_{OA} - I_{8B}$;

$I_{OA} = I0 + (Vbe_{OB} - Vbe_{OA} - VIN)/R0 - Vbe_{1B}/R0 - Ib_{1B} - Ib_{OA}$.

$I_{OB} = I0 + (Vbe_{OA} - Vbe_{OB} + VIN)/R0 - Ib_{OB} - I_{8A}$;

$I_{OB} = I0 + (Vbe_{OA} - Vbe_{OB} + VIN)/R0 - Vbe_{1A}/R0 - Ib_{1A} - Ib_{OB}$.

$$\begin{aligned}
I_+ &= I_{OA} + Ib_{1A} + Vbe_{1A}/R0 \\
&= I0 + (Vbe_{OB} - Vbe_{OA} + Vbe_{1A} - Vbe_{1B} - VIN)/R0 + \\
&\quad Ib_{1A} - Ib_{OA} - Ib_{1B}. \\
&= I0 - VIN/R0 - Ib_{1B}.
\end{aligned}$$

$$\begin{aligned}
I_- &= I_{OB} + Ib_{1B} + Vbe_{1B}/R0 \\
&= I0 + (Vbe_{OA} - Vbe_{OB} + Vbe_{1B} - Vbe_{1A} + VIN)/R0 + \\
&\quad Ib_{1B} - Ib_{OB} - Ib_{1A} \\
&= I0 + VIN/R0 - Ib_{1A}.
\end{aligned}$$

Hence:

$Iout -2VIN/R0 + Ib_{1A} Ib_{1B}$;

$I_+ + I_- = 2I0 - Ib_{1A} - Ib_{1B}$.

Thus in this embodiment both differential and single-ended outputs are linearized.

Figure 20:
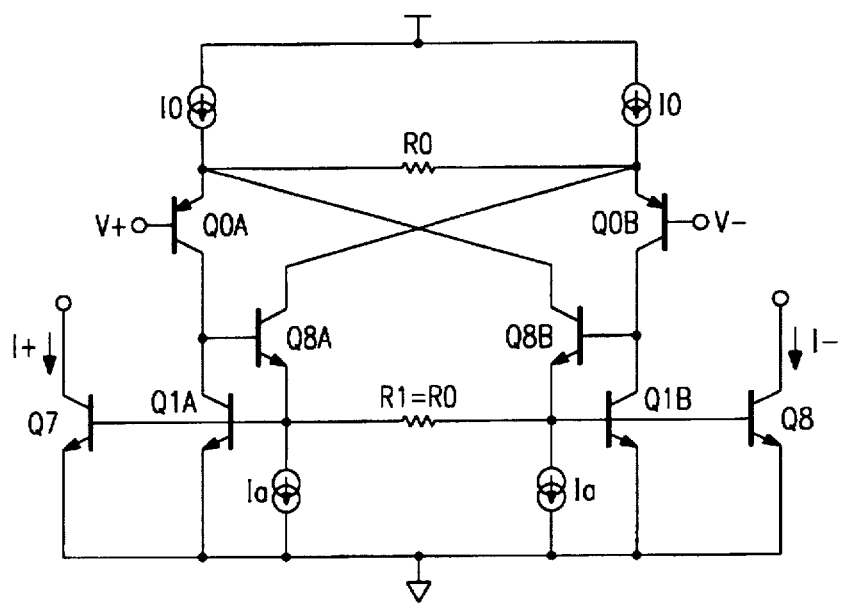

FIG. 20 is generally similar to the embodiment of FIG. 19, except that R1 is bridged and a pair of current mirrors is added. Neglecting $Ib_{8A}$ and $Ib_{8B}$:

$I_{OA} = I0 + (Vbe_{OB} - Vbe_{OA} - VIN)/R0 - Ib_{OA} - I_{8B}$;

$I_{OA} = I0 + (Vbe_{OB} - Vbe_{OA} - VIN)/R0 - (Vbe_{1B} - Vbe_{1A})/R0 - Ia - 2Ib_{1B} - Ib_{OA}$.

Hence

-continued $$\begin{aligned}
I_{OA} &= I0 - Ia + (Vbe_{OB} - Vbe_{OA} + Vbe_{1A} - Vbe_{1B} - VIN)/R0 - \\
&\quad 2Ib_{1B} - Ib_{OA} \\
&= I0 - Ia - VIN/R0 - 2Ib_{1B} - Ib_{OA}.
\end{aligned}$$

$I_{OB} = I0 + (Vbe_{OA} - Vbe_{OB} + VIN)/R0 - Ib_{OB} - I_{8A}$;

$I_{OB} = I0 + (Vbe_{OA} - Vbe_{OB} + VIN)/R0 - (Vbe_{1A} - Vbe_{1B})/R0 - Ia - 2Ib_{1A} - Ib_{OB}$.

Hence $$\begin{aligned}
I_{OB} &= I0 - Ia + (Vbe_{OA} - Vbe_{OB} + Vbe_{1B} - Vbe_{1A} + VIN)/R0 - 2Ib_{1A} - \\
&\quad Ib_{OB} \\
&= I0 - Ia + VIN/R0 - 2Ib_{1A} - Ib_{OB}.
\end{aligned}$$

$I_+ = I_{OA}$;

$I_- = I_{OB}$.

Hence:

$Iout = -2VIN/R0 + Ib_{1A} - Ib_{1B}$.

And:

$I_+ + I_- = I0 - Ia - Ib_{OA} - Ib_{OB} - 2Ib_{1A} - 2Ib_{1B}$.

Thus in this embodiment both differential and single-ended outputs are linearized.

Figure 21:
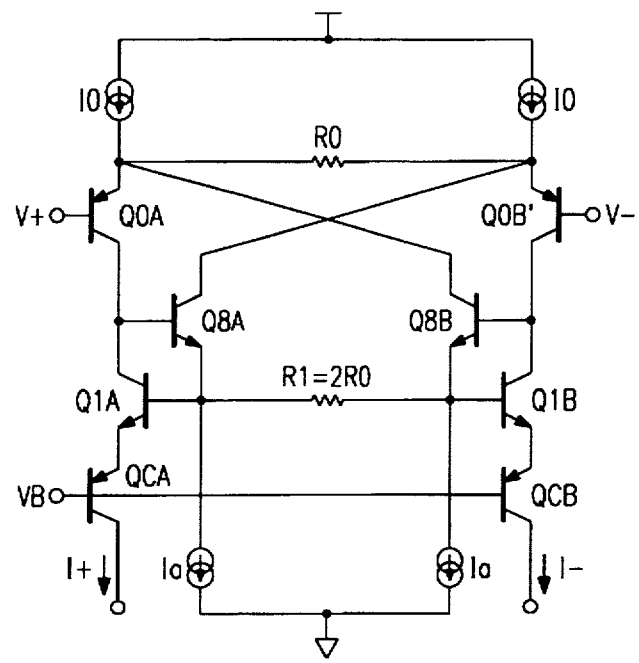

FIG. 21 is generally similar to the embodiment of FIG. 20, except that a pair of PNP cascode transistors (QCA and QCB) is added. In this embodiment, like that of FIG. 20, both differential and single-ended outputs are linearized.

Figure 22:
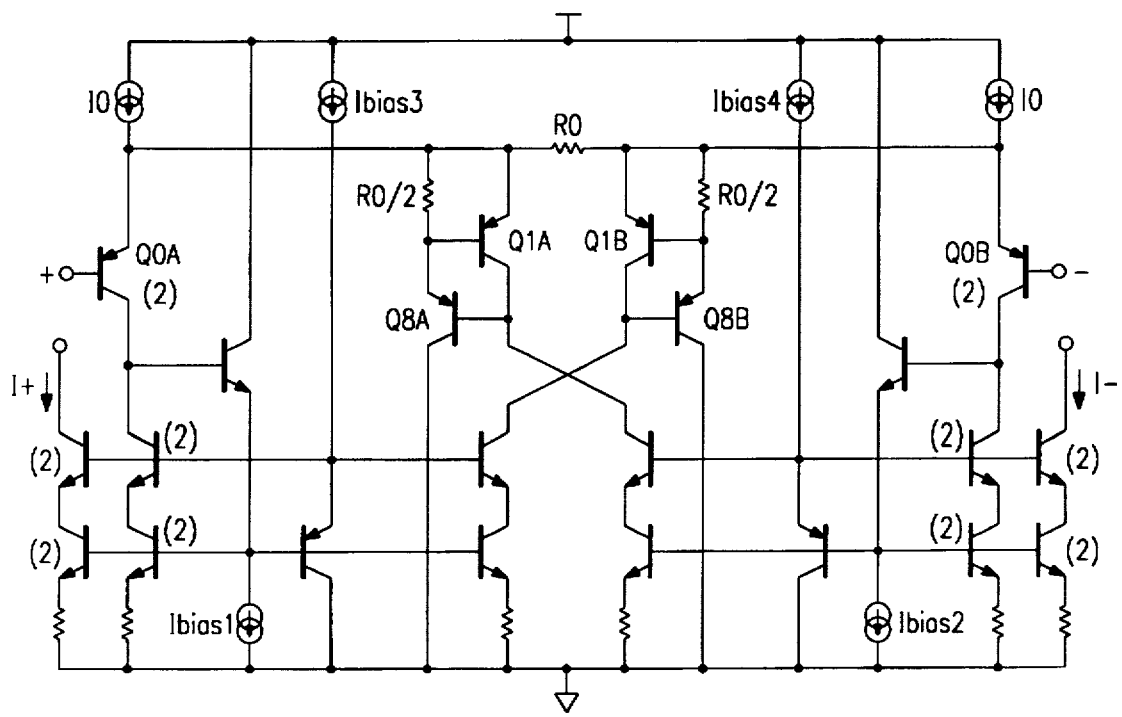
FIG. 22 is a further modification of the embodiment of FIG. 19.

FIG. 22 is another differential scheme, similar to FIG. 19.

Circuit Advantages

Some of the notable advantages which result from the structures described above include the following. However, it must be understood that this is NOT an exhaustive list.

Note that these configurations provide quasi-open-loop structures, and hence are faster than comparable closed-loop circuits. For the same reason the innovative circuits are smaller, since no compensation capacitor is required for stability. Compactness and simplicity are beneficial to component matching since components can be laid out close to each other on the die.

Most PNPs are used in common-base configuration (and only rarely in current mirrors), which improves speed.

The disclosed innovations provide high-linearity voltage to current conversion (nonlinearity is typically less than 0.5%).

Using the disclosed innovations, gain error is typically from 0.1 to a few percent, depending on the circuit. (This is essentially due to finite beta effects that can be compensated by proper setting of the reference currents I0.)

Some circuits are even exempt of beta-dependent output errors, thus providing high temperature stability at low cost.

Some of the transconductors provide linear and fast voltage to current conversion even for low values of the resistors R0, hence achieving high gain (FIGS. 10, 14, 15, 18, 20). This is unique for open-loop voltage to current converters: classical circuits achieve precision and speed at the cost of a low transconductance 1/R0, always detrimental to gain and offset.

Note that the disclosed circuits use very few cascaded mirrors, which usually degrade offset.

Note that the disclosed circuits can tolerate high input/output voltage swings, and can readily provide multiple outputs.

13

Applications to Integrated Systems

Figure 23:
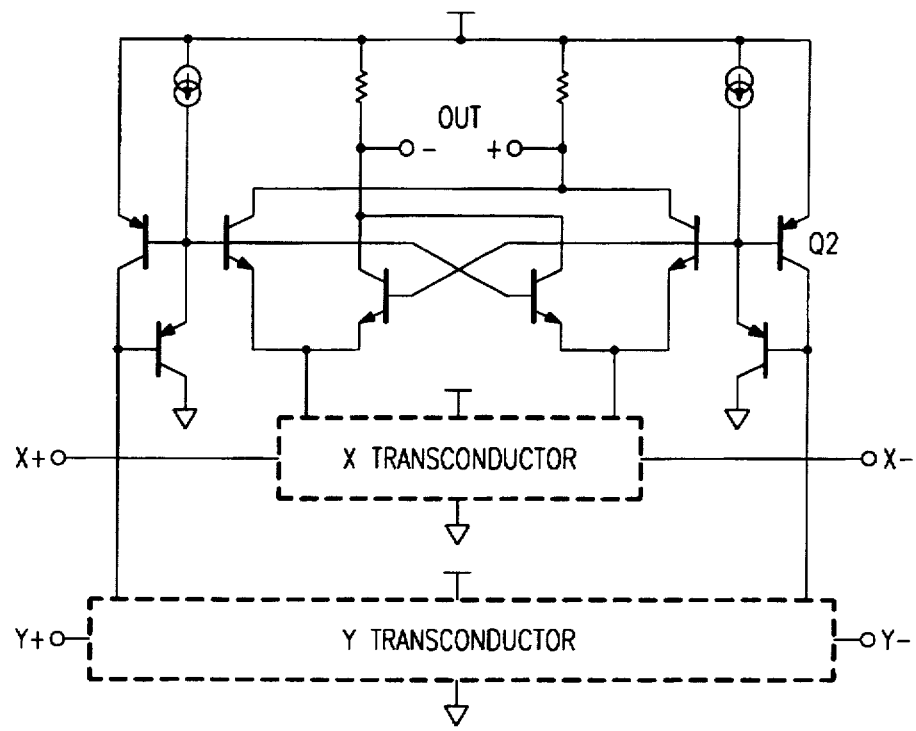
FIGS. 23 and 24 show two examples of larger-scale integrated circuit subsystems in which the disclosed transconductor circuits are advantageously used.

It is well known that transconductors are a highly versatile analog building block. The disclosed inventions not only provide improved transconductor circuit characteristics, but enable improvements to be made in larger-scale analog circuits. For example, the present invention provides improved:

Biasing circuits;
Precision multipliers/dividers (FIG. 23);
AGC circuits (FIG. 24); and
Instrumentation amplifiers.

Figure 24:
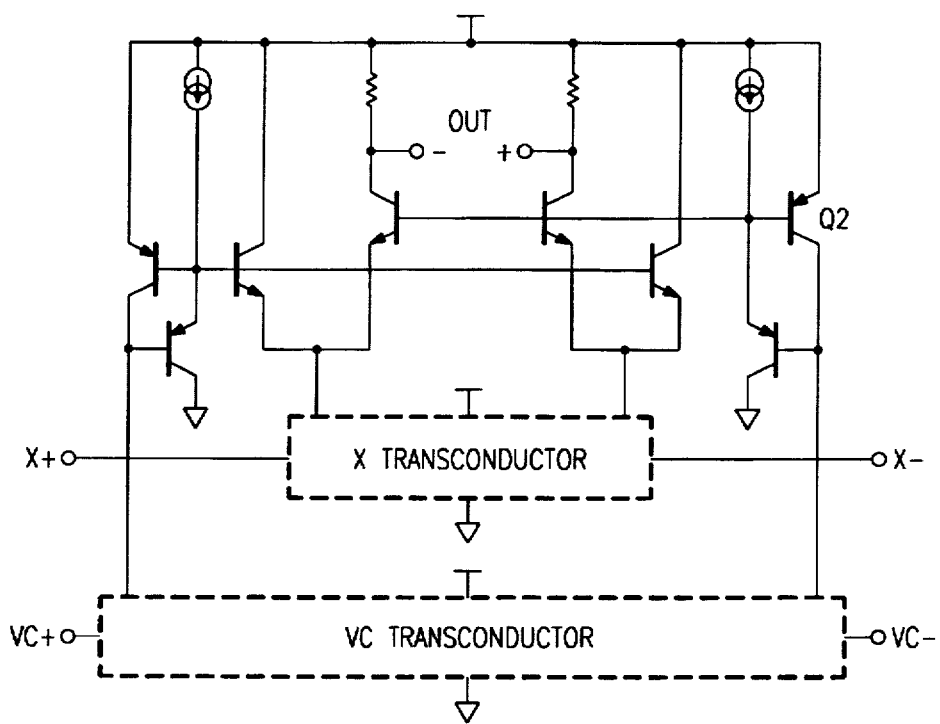

FIGS. 23 and 24 show two examples of such larger-scale integrated circuit subsystems in which the transconductor circuits described above provide advantages. FIG. 23 shows a 4-quadrant analog multiplier, and FIG. 24 shows a voltage-controlled variable-gain amplifier. Of course, the innovative transconductor circuits can be used in numerous other specific implementations, but these two Figures will provide some indication.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, any of the specific circuits shown can be inverted to produce a current source of opposite polarity, by appropriate selection of complementary transistors, with connections of ground and voltage Vcc being then inverted.

Similarly, some of the disclosed structures are readily translatable to CMOS or BICMOS circuits.

In addition, it will in many cases be possible to replace specific blocks, within one of the overall circuit configurations shown, with other blocks of the same functionality. For example, as will be readily recognized by those skilled in the art of analog design, there are many types of current sources, current mirrors, loads, etc.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A transconductor circuit, comprising:

an input transistor configured to receive an input voltage on the base thereof;

a first resistance coupled to said input transistor, said input transistor generating a first resistance current through said first resistance to thereby produce a collector current on a collector of said input transistor which is approximately equal to said input voltage to said input transistor divided by the resistance value of said first resistance;

an output circuit to generate a current equal to said collector current in said input transistor;

a compensation circuit coupled to said output circuit to produce a first compensation current component which is equal to the base current of said input transistor; and a second resistance matched to said first resistance and coupled to said compensation circuit, said compensa-

14 tion circuit generating, in said second resistance, a second current compensation component corresponding to the base-emitter voltage drop of said input transistor divided by the resistance value of said first reference resistance, to provide a second compensation current, said output circuit combining said current with said first and second compensation currents to generate an output current which very closely approximates the input voltage divided by the resistance value of said first reference resistance.

2. The transconductor circuit of claim 1 wherein said output circuit includes a current mirror coupled to said input transistor to generate said first current.

3. The transconductor circuit of claim 1 wherein said compensation circuit includes a second transistor coupled to said output circuit to generate said first compensation current.

4. The transconductor circuit of claim 3 wherein said second resistance is coupled between the base and emitter of said second transistor to generate said second compensation current.

5. The transconductor circuit of claim 3, further including a third transistor coupled to said second transistor to compensate said first compensation current for a base current required to drive said second transistor.

6. A transconductor circuit, comprising:

first and input transistors configured to receive a differential input voltage on the bases thereof;

a first resistance circuit coupled between said pair of first transistors, said pair of first transistors generating a first resistance current through said first resistance circuit to thereby produce a collector current on a collector of each of said first transistors which is approximately equal to said input voltage to each of said transistors divided by the resistance value of said first resistance circuit;

an output circuit to generate first and second currents equal to said collector currents in said first and second transistors, respectively;

a compensation circuit coupled to said output circuit to produce a pair of first compensation current components which are equal to the base currents of said first and second transistors, respectively; and a second resistance circuit matched to said first resistance circuit and coupled to said compensation circuit, said compensation circuit generating, in said second resistance circuit, a second pair of current compensation components corresponding to the base-emitter voltage drop of respective said first transistors divided by the resistance value of said first reference resistance circuit current, said output circuit combining said first and second currents with said first and second respective compensation currents to generate a differential output current which very closely approximates the differential input voltage divided by the resistance value of said first reference resistance.

7. The transconductor circuit of claim 6 wherein said output circuit includes first and second current mirror circuits coupled to said first and second input transistors, respectively, to generate said first and second currents.

8. The transconductor circuit of claim 6 wherein said compensation circuit includes third and fourth transistors coupled to said output circuit to produce said pair of first compensation currents.

9. The transconductor circuit of claim 8 wherein said second resistance circuit comprises a first resistor coupled between said third and fourth transistors to generate said second pair of compensation currents.

10. The transconductor circuit of claim 3, further including fourth and fifth transistors coupled to said third and fourth transistors, respectively, to compensate said pair of first compensation currents for a base current required to drive said third and fourth transistors.

11. A differential transconductor integrated circuit, comprising:

a pair of first bipolar transistors configured to receive a differential input voltage on the bases thereof;

a first resistance coupled between said pair of first transistors in a bridge configuration, said pair of first transistors generating a first current through said first resistance to thereby produce a collector current on a collector of each of said first transistors which is approximately equal to said input voltage to each of said transistors divided by the resistance value of said first resistance;

a pair of second bipolar transistors, each of which is matched to a respective said first transistor, to generate a collector current that is equal to the collector current of its respective said first transistor, while holding the base-emitter voltage of each of said second transistor equal to the base-emitter voltage of its respective said first transistor, to thereby produce a pair of first compensation current components which are equal to the base currents of respective said first transistors, and also to the base current of respective said second transistors;

a second resistance matched to said first resistance and coupled to said pair of second transistors in a bridge configuration, said pair of second of second transistors generating, in said second resistance, a second current compensation component corresponding to the base-emitter voltage drop of respective said first transistors divided by the resistance value of said first reference resistance; and an output circuit to combine respective said first and second current compensation components with a pair of components corresponding to respective said collector currents, to thereby generate a pair of current outputs which very closely approximate the respective input voltages divided by the resistance values of said first reference resistance.

\* \* \* \* \*